(12) United States Patent
Wang et al.

(10) Patent No.: US 8,378,372 B2
(45) Date of Patent: Feb. 19, 2013

(54) SEMICONDUCTOR CHIP ASSEMBLY WITH POST/BASE HEAT SPREADER AND HORIZONTAL SIGNAL ROUTING

(75) Inventors: Chia-Chung Wang, Hsinchu (TW); Charles W. C. Lin, Singapore (SG)

(73) Assignee: Bridge Semiconductor Corporation, Taipei (TW)

( * ) Notice: Subject to any disclaimer, the term of this patent is extended or adjusted under 35 U.S.C. 154(b) by 530 days.

(21) Appl. No.: 12/557,540

(22) Filed: Sep. 11, 2009

(65) Prior Publication Data

US 2010/0001309 A1 Jan. 7, 2010

Related U.S. Application Data

(63) Continuation-in-part of application No. 12/406,510, filed on Mar. 18, 2009.

(60) Provisional application No. 61/071,589, filed on May 7, 2008, provisional application No. 61/071,588, filed (Continued)

(51) Int. Cl.
*H01L 33/00* (2010.01)

(52) U.S. Cl. ............. 257/99; 257/98; 257/E33.001; 438/22

(58) Field of Classification Search .......... 257/99, 257/98, E33.001; 29/827; 438/22, 26, 112
See application file for complete search history.

(56) References Cited

U.S. PATENT DOCUMENTS

| | | | |
|---|---|---|---|
| 3,689,993 A | 9/1972 | Tolar | 438/380 |
| 3,969,199 A | 7/1976 | Berdan et al. | 205/177 |
| 4,420,767 A | 12/1983 | Hodge et al. | 257/713 |
| 4,509,096 A | 4/1985 | Baldwin et al. | 257/706 |
| 5,012,386 A | 4/1991 | McShane et al. | 361/386 |
| 5,102,829 A | 4/1992 | Cohn | 437/217 |
| 5,379,187 A | 1/1995 | Lee et al. | 361/707 |
| 5,457,605 A | 10/1995 | Wagner et al. | 361/720 |
| 5,543,586 A | 8/1996 | Crane, Jr. et al. | 174/262 |
| 5,644,163 A | 7/1997 | Tsuji | 257/706 |
| 5,991,156 A | 11/1999 | Bond et al. | 361/707 |
| 6,057,601 A | 5/2000 | Lau et al. | 257/738 |
| 6,160,705 A | 12/2000 | Stearns et al. | 361/704 |
| 6,162,664 A | 12/2000 | Kim | 438/126 |
| 6,281,568 B1 | 8/2001 | Glenn et al. | 257/684 |
| 6,313,525 B1 | 11/2001 | Sasano | 257/704 |
| 6,453,549 B1 * | 9/2002 | Bhatt et al. | 29/837 |
| 6,495,914 B1 | 12/2002 | Sekine et al. | 257/723 |
| 6,498,355 B1 | 12/2002 | Harrah et al. | 257/99 |
| 6,507,102 B2 | 1/2003 | Juskey et al. | 257/406 |
| 6,528,882 B2 | 3/2003 | Ding et al. | 257/738 |
| 6,541,832 B2 | 4/2003 | Coyle | 257/415 |
| 6,583,444 B2 | 6/2003 | Fjelstad | 257/82 |
| 6,603,209 B1 | 8/2003 | DiStefano et al. | 257/781 |

(Continued)

FOREIGN PATENT DOCUMENTS

JP  2005-166775  6/2005

*Primary Examiner* — Eugene Lee
*Assistant Examiner* — Fang-Xing Jiang
(74) *Attorney, Agent, or Firm* — Jackson IPG PLLC

(57) ABSTRACT

A semiconductor chip assembly includes a semiconductor device, a heat spreader, a substrate and an adhesive. The semiconductor device is electrically connected to the substrate and thermally connected to the heat spreader. The heat spreader includes a post and a base. The post extends upwardly through an opening in the adhesive into an aperture in the substrate, and the base extends laterally from the post. The adhesive extends between the post and the substrate and between the base and the substrate. The substrate includes first and second conductive layers and a dielectric layer therebetween and provides horizontal signal routing between a pad and a terminal at the first conductive layer.

35 Claims, 22 Drawing Sheets

Related U.S. Application Data on May 7, 2008, provisional application No. 61/071,072, filed on Apr. 11, 2008, provisional application No. 61/064,748, filed on Mar. 25, 2008, provisional application No. 61/150,980, filed on Feb. 9, 2009.

(56) References Cited

U.S. PATENT DOCUMENTS

| | | | |
|---|---|---|---|
| 6,608,376 B1 | 8/2003 | Liew et al. | 257/698 |
| 6,625,028 B1 | 9/2003 | Dove et al. | 361/707 |
| 6,670,219 B2 | 12/2003 | Lee et al. | 438/107 |
| 6,683,795 B1 | 1/2004 | Yoo | 361/816 |
| 6,720,651 B2 | 4/2004 | Gaku et al. | 257/707 |
| 6,744,135 B2 | 6/2004 | Hasebe et al. | 257/712 |
| 6,861,750 B2 | 3/2005 | Zhao et al. | 257/739 |
| 6,900,535 B2 | 5/2005 | Zhao | 257/707 |
| 6,906,414 B2 | 6/2005 | Zhao et al. | 257/707 |
| 6,936,855 B1 | 8/2005 | Harrah | 257/88 |
| 6,964,877 B2 | 11/2005 | Chen et al. | 438/20 |
| 7,038,311 B2 | 5/2006 | Woodall et al. | 257/706 |
| 7,196,403 B2 | 3/2007 | Karim | 257/675 |
| 7,335,522 B2 | 2/2008 | Wang et al. | 438/26 |
| 7,470,935 B2 | 12/2008 | Lee et al. | 257/98 |
| 7,495,322 B2 | 2/2009 | Hashimoto et al. | 257/676 |
| 7,582,951 B2 | 9/2009 | Zhao et al. | 257/660 |
| 7,642,137 B2 | 1/2010 | Lin et al. | 438/127 |
| 7,690,817 B2 | 4/2010 | Sanpei et al. | 362/294 |
| 7,741,158 B2 | 6/2010 | Leung et al. | 438/122 |
| 7,781,266 B2 | 8/2010 | Zhao et al. | 438/123 |
| 7,808,087 B2 | 10/2010 | Zhao et al. | 257/670 |
| 7,812,360 B2 | 10/2010 | Yano | 257/98 |
| 7,956,372 B2 | 6/2011 | Kamada et al. | 257/98 |
| 8,030,676 B2 | 10/2011 | Lin | 257/99 |
| 8,067,784 B2 * | 11/2011 | Lin et al. | 257/99 |
| 8,071,998 B2 | 12/2011 | Chen | 257/99 |
| 8,153,477 B2 * | 4/2012 | Lin et al. | 438/122 |
| 8,178,395 B2 * | 5/2012 | Lin et al. | 438/122 |
| 8,193,556 B2 * | 6/2012 | Lin et al. | 257/99 |
| 8,203,167 B2 * | 6/2012 | Lin et al. | 257/99 |
| 8,207,019 B2 * | 6/2012 | Lin et al. | 438/122 |
| 8,227,270 B2 * | 7/2012 | Lin et al. | 438/26 |
| 8,232,573 B2 * | 7/2012 | Lin et al. | 257/98 |
| 8,236,619 B2 * | 8/2012 | Lin et al. | 438/122 |
| 8,298,868 B2 * | 10/2012 | Lin et al. | 438/122 |
| 2003/0189830 A1 | 10/2003 | Sugimoto et al. | 362/294 |
| 2004/0061433 A1 | 4/2004 | Izuno et al. | 313/498 |
| 2004/0065894 A1 | 4/2004 | Hashimoto et al. | 257/100 |
| 2005/0024834 A1 | 2/2005 | Newby | 361/719 |
| 2005/0135105 A1 | 6/2005 | Teixeira et al. | 362/294 |
| 2005/0185880 A1 | 8/2005 | Asai | 385/14 |
| 2005/0274959 A1 | 12/2005 | Kim et al. | 257/79 |
| 2006/0012967 A1 | 1/2006 | Asai et al. | 361/764 |
| 2006/0054915 A1 | 3/2006 | Chang | 257/100 |
| 2006/0109632 A1 | 5/2006 | Berlin et al. | 361/719 |
| 2006/0131735 A1 | 6/2006 | Ong et al. | 257/706 |
| 2007/0063213 A1 | 3/2007 | Hsieh et al. | 257/99 |
| 2007/0077416 A1 | 4/2007 | Ito et al. | 428/339 |
| 2007/0090522 A1 | 4/2007 | Alhayek et al. | 257/723 |
| 2007/0252166 A1 | 11/2007 | Chang et al. | 257/98 |
| 2007/0267642 A1 | 11/2007 | Erchak et al. | 257/98 |
| 2007/0290322 A1 | 12/2007 | Zhao et al. | 257/690 |
| 2008/0019133 A1 | 1/2008 | Kim et al. | 362/294 |
| 2008/0099770 A1 | 5/2008 | Mendendorp et al. | 257/79 |
| 2008/0102631 A1 | 5/2008 | Andryushchenko et al. | 438/686 |
| 2008/0173884 A1 | 7/2008 | Chitnis et al. | 257/98 |
| 2008/0180824 A1 | 7/2008 | Endoh et al. | 359/894 |
| 2009/0309213 A1 | 12/2009 | Takahashi et al. | 257/707 |
| 2010/0149756 A1 | 6/2010 | Rowcliffe et al. | 361/714 |
| 2010/0291737 A1 | 11/2010 | Ikeguchi et al. | 438/108 |
| 2011/0133204 A1 | 6/2011 | Lai | 257/76 |

* cited by examiner

SEMICONDUCTOR CHIP ASSEMBLY WITH POST/BASE HEAT SPREADER AND HORIZONTAL SIGNAL ROUTING

CROSS-REFERENCE TO RELATED APPLICATIONS

This application is a continuation-in-part of U.S. application Ser. No. 12/406,510 filed Mar. 18, 2009, which claims the benefit of U.S. Provisional Application Ser. No. 61/071,589 filed May 7, 2008, U.S. Provisional Application Ser. No. 61/071,588 filed May 7, 2008, U.S. Provisional Application Ser. No. 61/071,072 filed Apr. 11, 2008, and U.S. Provisional Application Ser. No. 61/064,748 filed Mar. 25, 2008, each of which is incorporated by reference.

This application also claims the benefit of U.S. Provisional Application Ser. No. 61/150,980 filed Feb. 9, 2009, which is incorporated by reference.

BACKGROUND OF THE INVENTION

1. Field of the Invention

The present invention relates to semiconductor chip assembly, and more particularly to a semiconductor chip assembly with a semiconductor device, a substrate, an adhesive and a heat spreader and its method of manufacture.

2. Description of the Related Art

Semiconductor devices such as packaged and unpackaged semiconductor chips have high voltage, high frequency and high performance applications that require substantial power to perform the specified functions. As the power increases, the semiconductor device generates more heat. Furthermore, the heat build-up is aggravated by higher packing density and smaller profile sizes which reduce the surface area to dissipate the heat.

Semiconductor devices are susceptible to performance degradation as well as short life span and immediate failure at high operating temperatures. The heat not only degrades the chip, but also imposes thermal stress on the chip and surrounding elements due to thermal expansion mismatch. As a result, the heat must be dissipated rapidly and efficiently from the chip to ensure effective and reliable operation. A high thermal conductivity path typically requires heat conduction and heat spreading to a much larger surface area than the chip or a die pad it is mounted on.

Light emitting diodes (LEDs) have recently become popular alternatives to incandescent, fluorescent and halogen light sources. LEDs provide energy efficient, cost effective, long term lighting for medical, military, signage, signal, aircraft, maritime, automotive, portable, commercial and residential applications. For instance, LEDs provide light sources for lamps, flashlights, headlights, flood lights, traffic lights and displays.

LEDs include high power chips that generate high light output and considerable heat. Unfortunately, LEDs exhibit color shifts and low light output as well as short lifetimes and immediate failure at high operating temperatures. Furthermore, LED light output and reliability are constrained by heat dissipation limits. LEDs underscore the critical need for providing high power chips with adequate heat dissipation.

LED packages usually include an LED chip, a submount, electrical contacts and a thermal contact. The submount is thermally connected to and mechanically supports the LED chip. The electrical contacts are electrically connected to the anode and cathode of the LED chip. The thermal contact is thermally connected to the LED chip by the submount but requires adequate heat dissipation by the underlying carrier to prevent the LED chip from overheating.

Packages and thermal boards for high power chips have been developed extensively in the industry with a wide variety of designs and manufacturing techniques in attempts to meet performance demands in an extremely cost-competitive environment.

Plastic ball grid array (PBGA) packages have a chip and a laminated substrate enclosed in a plastic housing and are attached to a printed circuit board (PCB) by solder balls. The laminated substrate includes a dielectric layer that often includes fiberglass. The heat from the chip flows through the plastic and the dielectric layer to the solder balls and then the PCB. However, since the plastic and the dielectric layer typically have low thermal conductivity, the PBGA provides poor heat dissipation.

Quad-Flat-No Lead (QFN) packages have the chip mounted on a copper die pad which is soldered to the PCB. The heat from the chip flows through the die pad to the PCB. However, since the lead frame type interposer has limited routing capability, the QFN package cannot accommodate high input/output (I/O) chips or passive elements.

Thermal boards provide electrical routing, thermal management and mechanical support for semiconductor devices. Thermal boards usually include a substrate for signal routing, a heat spreader or heat sink for heat removal, pads for electrical connection to the semiconductor device and terminals for electrical connection to the next level assembly. The substrate can be a laminated structure with single layer or multi-layer routing circuitry and one or more dielectric layers. The heat spreader can be a metal base, a metal slug or an embedded metal layer.

Thermal boards interface with the next level assembly. For instance, the next level assembly can be a light fixture with a printed circuit board and a heat sink. In this instance, an LED package is mounted on the thermal board, the thermal board is mounted on the heat sink, the thermal board/heat sink subassembly and the printed circuit board are mounted in the light fixture and the thermal board is electrically connected to the printed circuit board by wires. The substrate routes electrical signals to the LED package from the printed circuit board and the heat spreader spreads and transfers heat from the LED package to the heat sink. The thermal board thus provides a critical thermal path for the LED chip.

U.S. Pat. No. 6,507,102 to Juskey et al. discloses an assembly in which a composite substrate with fiberglass and cured thermosetting resin includes a central opening, a heat slug with a square or rectangular shape resembling the central opening is attached to the substrate at sidewalls of the central opening, top and bottom conductive layers are attached to the top and bottom of the substrate and electrically connected to one another by plated through-holes through the substrate, a chip is mounted on the heat slug and wire bonded to the top conductive layer, an encapsulant is molded on the chip and solder balls are placed on the bottom conductive layer.

During manufacture, the substrate is initially a prepreg with B-stage resin placed on the bottom conductive layer, the heat slug is inserted into the central opening and on the bottom conductive layer and spaced from the substrate by a gap, the top conductive layer is mounted on the substrate, the conductive layers are heated and pressed towards one another so that the resin melts, reflows into the gap and solidifies, the conductive layers are patterned to form circuit traces on the substrate and expose the excess resin flash on the heat slug, and the excess resin flash is removed to expose the heat slug. The chip is then mounted on the heat slug, wire bonded and encapsulated.

The heat flows from the chip through the heat slug to the PCB. However, manually dropping the heat slug into the central opening is prohibitively cumbersome and expensive for high volume manufacture. Furthermore, since the heat slug is difficult to accurately position in the central opening due to tight lateral placement tolerance, voids and inconsistent bond lines arise between the substrate and the heat slug. The substrate is therefore partially attached to the heat slug, fragile due to inadequate support by the heat slug and prone to delamination. In addition, the wet chemical etch that removes portions of the conductive layers to expose the excess resin flash also removes portions of the heat slug exposed by the excess resin flash. The heat slug is therefore non-planar and difficult to bond to. As a result, the assembly suffers from high yield loss, poor reliability and excessive cost.

U.S. Pat. No. 6,528,882 to Ding et al. discloses a thermal enhanced ball grid array package in which the substrate includes a metal core layer. The chip is mounted on a die pad region at the top surface of the metal core layer, an insulating layer is formed on the bottom surface of the metal core layer, blind vias extend through the insulating layer to the metal core layer, thermal balls fill the blind vias and solder balls are placed on the substrate and aligned with the thermal balls. The heat from the chip flows through the metal core layer to the thermal balls to the PCB. However, the insulating layer sandwiched between the metal core layer and the PCB limits the heat flow to the PCB.

U.S. Pat. No. 6,670,219 to Lee et al. discloses a cavity down ball grid array (CDBGA) package in which a ground plate with a central opening is mounted on a heat spreader to form a thermal dissipating substrate. A substrate with a central opening is mounted on the ground plate using an adhesive with a central opening. A chip is mounted on the heat spreader in a cavity defined by the central opening in the ground plate and solder balls are placed on the substrate. However, since the solder balls extend above the substrate, the heat spreader does not contact the PCB. As a result, the heat spreader releases the heat by thermal convection rather than thermal conduction which severely limits the heat dissipation.

U.S. Pat. No. 7,038,311 to Woodall et al. discloses a thermal enhanced BGA package in which a heat sink with an inverted T-like shape includes a pedestal and an expanded base, a substrate with a window opening is mounted on the expanded base, an adhesive attaches the pedestal and the expanded base to the substrate, a chip is mounted on the pedestal and wire bonded to the substrate, an encapsulant is molded on the chip and solder balls are placed on the substrate. The pedestal extends through the window opening, the substrate is supported by the expanded base and the solder balls are located between the expanded base and the perimeter of the substrate. The heat from the chip flows through the pedestal to the expanded base to the PCB. However, since the expanded base must leave room for the solder balls, the expanded base protrudes below the substrate only between the central window and the innermost solder ball. Consequently, the substrate is unbalanced and wobbles and warps during manufacture. This creates enormous difficulties with chip mounting, wire bonding and encapsulant molding. Furthermore, the expanded base may be bent by the encapsulant molding and may impede soldering the package to the next level assembly as the solder balls collapse. As a result, the package suffers from high yield loss, poor reliability and excessive cost.

U.S. Patent Application Publication No. 2007/0267642 to Erchak et al. discloses a light emitting device assembly in which a base with an inverted T-like shape includes a substrate, a protrusion and an insulative layer with an aperture, electrical contacts are mounted on the insulative layer, a package with an aperture and a transparent lid is mounted on the electrical contacts and an LED chip is mounted on the protrusion and wire bonded to the substrate. The protrusion is adjacent to the substrate and extends through the apertures in the insulative layer and the package into the package, the insulative layer is mounted on the substrate, the electrical contacts are mounted on the insulative layer and the package is mounted on the electrical contacts and spaced from the insulative layer. The heat from the chip flows through the protrusion to the substrate to a heat sink. However, the electrical contacts are difficult to mount on the insulative layer, difficult to electrically connect to the next level assembly and fail to provide multi-layer routing.

Conventional packages and thermal boards thus have major deficiencies. For instance, dielectrics with low thermal conductivity such as epoxy limit heat dissipation, whereas dielectrics with higher thermal conductivity such as epoxy filled with ceramic or silicon carbide have low adhesion and are prohibitively expensive for high volume manufacture. The dielectric may delaminate during manufacture or prematurely during operation due to the heat. The substrate may have single layer circuitry with limited routing capability or multi-layer circuitry with thick dielectric layers which reduce heat dissipation. The heat spreader may be inefficient, cumbersome or difficult to thermally connect to the next level assembly. The manufacturing process may be unsuitable for low cost, high volume manufacture.

In view of the various development stages and limitations in currently available packages and thermal boards for high power semiconductor devices, there is a need for a semiconductor chip assembly that is cost effective, reliable, manufacturable, versatile, provides flexible signal routing and has excellent heat spreading and dissipation.

SUMMARY OF THE INVENTION

The present invention provides a semiconductor chip assembly that includes a semiconductor device, a heat spreader, a substrate and an adhesive. The semiconductor device is electrically connected to the substrate and thermally connected to the heat spreader. The heat spreader includes a post and a base. The post extends upwardly through an opening in the adhesive into an aperture in the substrate, and the base extends laterally from the post. The adhesive extends between the post and the substrate and between the base and the substrate. The substrate includes first and second conductive layers and a dielectric layer therebetween and provides horizontal signal routing.

The substrate can provide the horizontal signal routing between a pad and a terminal at the first conductive layer using a routing line at the second conductive layer and first and second vias through the dielectric layer between the conductive layers.

In accordance with an aspect of the present invention, a semiconductor chip assembly includes a semiconductor device, an adhesive, a heat spreader and a substrate. The adhesive includes an opening. The heat spreader includes a post and a base, wherein the post is adjacent to the base and extends above the base in an upward direction, and the base extends below the post in a downward direction opposite the upward direction and extends laterally from the post in lateral directions orthogonal to the upward and downward directions. The substrate includes a pad, a terminal, a routing line, first and second vias and a dielectric layer, wherein the pad and the terminal extend above the dielectric layer, the routing line extends below the dielectric layer, the vias each extend through the dielectric layer to the routing line, an electrically conductive path between the pad and the terminal includes the first via, the routing line and the second via, and an aperture extends through the substrate.

The semiconductor device is above and overlaps the post, is electrically connected to the pad and thereby electrically connected to the terminal, and is thermally connected to the post and thereby thermally connected to the base.

The adhesive is mounted on and extends above the base, extends into a gap in the aperture between the post and the substrate, extends across the dielectric layer in the gap and is sandwiched between the post and the dielectric layer, between the base and the dielectric layer and between the base and the routing line.

The substrate is mounted on the adhesive and extends above the base, and the routing line is embedded in the adhesive.

The post extends through the opening into the aperture and above the dielectric layer, and the base extends below the semiconductor device, the adhesive and the substrate.

The heat spreader can include a cap that is above and adjacent to and covers in the upward direction and extends laterally in the lateral directions from a top of the post. For instance, the cap can have a rectangular or square shape and the top of the post can have a circular shape. The cap can also contact and cover a portion of the adhesive that is coplanar with and adjacent to the post. The cap can also be coplanar with the pad and the terminal above the dielectric layer. In addition, the post can thermally connect the base and the cap. The heat spreader can be copper and consist of the post, the base and the cap. Alternatively, the heat spreader can consist of the post and the base. In either case, the heat spreader provides heat dissipation and spreading from the semiconductor device to the next level assembly.

The semiconductor device can be mounted on the heat spreader. For instance, the semiconductor device can be mounted on the heat spreader and the substrate, overlap the post and the pad, be electrically connected to the pad using a first solder joint and be thermally connected to the cap using a second solder joint. Alternatively, the semiconductor device can be mounted on the heat spreader but not the substrate, overlap the post but not the substrate, be electrically connected to the pad using a wire bond and be thermally connected to the cap using a die attach.

The semiconductor device can be a packaged or unpackaged semiconductor chip. For instance, the semiconductor device can be an LED package that includes an LED chip, is mounted on the heat spreader and the substrate, overlaps the post and the pad, is electrically connected to the pad using a first solder joint and is thermally connected to the post using a second solder joint. Alternatively, the semiconductor device can be a semiconductor chip that is mounted on the heat spreader but not the substrate, overlaps the post but not the substrate, is electrically connected to the pad using a wire bond and is thermally connected to the cap using a die attach.

The adhesive can contact the post and the dielectric layer in the gap and contact the base, the dielectric layer and the routing line outside the gap. The adhesive can also cover the substrate in the downward direction, cover and surround the post in the lateral directions and extend to peripheral edges of the assembly. The adhesive can also be coplanar with a top of the post. The adhesive can also fill the gap and the space between the base and the substrate and be contained in the space between the heat spreader and the substrate.

The post can be integral with the base. For instance, the post and the base can be a single-piece metal or include a single-piece metal at their interface. The post can also extend through the aperture. The post can also be coplanar with the adhesive above the dielectric layer.

The post can also have a cut-off conical shape in which its diameter decreases as it extends upwardly from the base to its flat top adjacent to the cap.

The base can cover the semiconductor device, the post, the substrate and the adhesive in the downward direction, support the substrate and extend to peripheral edges of the assembly.

The substrate can be spaced from the post and the base. The substrate can also be a laminated structure. The pad can be an electrical contact for the semiconductor device, the terminal can be an electrical contact for the next level assembly, and the pad and the terminal can provide horizontal signal routing between the semiconductor device and the next level assembly.

The assembly can be a first-level or second-level single-chip or multi-chip device. For instance, the assembly can be a first-level package that contains a single chip or multiple chips.

Alternatively, the assembly can be a second-level module that contains a single LED package or multiple LED packages, and each LED package can contain a single LED chip or multiple LED chips.

The present invention provides a method of making a semiconductor chip assembly that includes providing a post and a base, mounting an adhesive on the base including inserting the post through an opening in the adhesive, mounting a substrate on the adhesive including inserting the post into an aperture in the substrate to form a gap in the aperture between the post and the substrate, then flowing the adhesive into and upward in the gap, solidifying the adhesive, then mounting a semiconductor device on a heat spreader that includes the post and the base, electrically connecting the semiconductor device to the substrate and thermally connecting the semiconductor device to the heat spreader. The substrate includes first and second conductive layers and a dielectric layer therebetween and provides horizontal signal routing.

In accordance with an aspect of the present invention, a method of making a semiconductor chip assembly includes (1) providing a post, a base, an adhesive and a substrate, wherein (a) the substrate includes a first conductive layer, a second conductive layer and a dielectric layer therebetween, (b) the post is adjacent to the base, extends above the base in an upward direction, extends through an opening in the adhesive and extends into an aperture in the substrate, (c) the base extends below the post in a downward direction opposite the upward direction and extends laterally from the post in lateral directions orthogonal to the upward and downward directions, (d) the adhesive is mounted on and extends above the base, is sandwiched between the base and the substrate and is non-solidified, (e) the substrate is mounted on and extends above the adhesive, the first conductive layer extends above the dielectric layer, the dielectric layer extends above the second conductive layer, and (f) a gap is located in the aperture between the post and the substrate, then (2) flowing the adhesive into and upward in the gap, (3) solidifying the adhesive, then (4) mounting a semiconductor device on a heat spreader that includes the post and the base, wherein the semiconductor device overlaps the post, the substrate includes a pad, a terminal, a routing line and first and second vias, the pad and the terminal include selected portions of the first conductive layer, the routing line includes a selected portion of the second conductive layer and the vias each extend through the dielectric layer, (5) electrically connecting the semiconductor device to the pad, thereby electrically connecting the semiconductor device to the terminal, wherein an electrically conductive path between the pad and the terminal includes the first via, the routing line and the second via, and (6) thermally connecting the semiconductor device to the post, thereby thermally connecting the semiconductor device to the base.

In accordance with another aspect of the present invention, a method of making a semiconductor chip assembly includes (1) providing a post and a base, wherein the post is adjacent to and integral with the base and extends above the base in an upward direction, and the base extends below the post in a downward direction opposite the upward direction and extends laterally from the post in lateral directions orthogonal to the upward and downward directions, (2) providing an adhesive, wherein an opening extends through the adhesive, (3) providing a substrate that includes first and second conductive layers, first and second vias and a dielectric layer, wherein the dielectric layer is between the conductive layers, a routing line includes a selected portion of the second conductive layer, the vias each extend through the dielectric layer between the first conductive layer and the routing line, and an aperture extends through the substrate, (4) mounting the adhesive on the base, including inserting the post through the opening, wherein the adhesive extends above the base and the post extends through the opening, (5) mounting the substrate on the adhesive, including inserting the post into the aperture, wherein the substrate extends above the adhesive, the first conductive layer extends above the dielectric layer, the dielectric layer extends above the second conductive layer, the post extends through the opening into the aperture, the adhesive is sandwiched between the base and the substrate and is non-solidified, and a gap is located in the aperture between the post and the substrate, then (6) applying heat to melt the adhesive, (7) moving the base and the substrate towards one another, thereby moving the post upward in the aperture and applying pressure to the molten adhesive between the base and the substrate, wherein the pressure forces the molten adhesive to flow into and upward in the gap and the post and the molten adhesive extend above the dielectric layer, (8) applying heat to solidify the molten adhesive, thereby mechanically attaching the post and the base to the substrate, then (9) grinding the post, the adhesive and the first conductive layer such that the post, the adhesive and the first conductive layer are laterally aligned with one another at a top lateral surface that faces in the upward direction, then (10) providing a pad and a terminal that include selected portions of the first conductive layer, including removing selected portions of the first conductive layer, (11) providing a cap on the post that is above and adjacent to and covers in the upward direction and extends laterally in the lateral directions from a top of the post, then (12) mounting a semiconductor device on the cap, wherein a heat spreader includes the post, the base and the cap and the semiconductor device overlaps the post, (13) electrically connecting the semiconductor device to the pad, thereby electrically connecting the semiconductor device to the terminal, wherein an electrically conductive path between the pad and the terminal includes in sequence the first via, the routing line and the second via, and (14) thermally connecting the semiconductor device to the cap, thereby thermally connecting the semiconductor device to the base.

Providing the post and the base can include providing a metal plate, forming an etch mask on the metal plate that selectively exposes the metal plate, etching the metal plate in a pattern defined by the etch mask, thereby forming a recess in the metal plate that extends into but not through the metal plate, and then removing the etch mask, wherein the post is an unetched portion of the metal plate that protrudes above the base and is laterally surrounded by the recess, and the base is an unetched portion of the metal plate below the post and the recess.

Providing the adhesive can include providing a prepreg with uncured epoxy, flowing the adhesive can include melting the uncured epoxy and compressing the uncured epoxy between the base and the substrate, and solidifying the adhesive can include curing the molten uncured epoxy.

Providing the substrate can include forming first and second holes through the first and second conductive layers and the dielectric layer, depositing the first and second vias into the first and second holes, respectively, providing the routing line including removing selected portions of the second conductive layer, and then forming the aperture.

Providing the pad and the terminal can include grinding the post, the adhesive and the first conductive layer such that the post, the adhesive and the first conductive layer are laterally aligned with one another at a top lateral surface that faces in the upward direction, and then removing selected portions of the first conductive layer. The grinding can include grinding the adhesive without grinding the post and then grinding the post, the adhesive and the first conductive layer.

Providing the pad and the terminal can also include depositing a third conductive layer on the post, the adhesive and the first conductive layer after the grinding and then removing selected portions of the first and third conductive layers, wherein the pad and the terminal include selected portions of the first and third conductive layers. Depositing the third conductive layer can include electrolessly plating a first plated layer on the post, the adhesive and the first conductive layer and then electroplating a second plated layer on the first plated layer, and removing selected portions of the third conductive layer can include removing selected portions of the first and second plated layers.

Providing the heat spreader can include providing a cap on the post that is above and adjacent to and covers in the upward direction and extends laterally in the lateral directions from a top of the post after solidifying the adhesive and before mounting the semiconductor device.

Providing the cap can include depositing a third conductive layer on the post after the grinding and removing selected portions of the third conductive layer. For instance, providing the cap can include forming an etch mask on the third conductive layer, etching the third conductive layer using the etch mask to define the cap and then removing the etch mask. Likewise, the pad and the terminal can be formed by etching the first and third conductive layers using the etch mask to define the pad and the terminal.

Flowing the adhesive can include filling the gap with the adhesive. Flowing the adhesive can also include squeezing the adhesive through the gap, above the post and the substrate and on top surface portions of the post and the substrate adjacent to the gap.

Solidifying the adhesive can include mechanically bonding the post and the base to the substrate.

Mounting the semiconductor device can include mounting the semiconductor device on the cap. Mounting the semiconductor device can also include positioning the semiconductor device above and overlapping the post, the cap, the opening and the aperture.

Mounting the semiconductor device can include providing a first solder joint between an LED package that includes an LED chip and the pad and a second solder joint between the LED package and the cap, electrically connecting the semiconductor device can include providing the first solder joint between the LED package and the pad, and thermally connecting the semiconductor device can include providing the second solder joint between the LED package and the cap.

Mounting the semiconductor device can include providing a die attach between a semiconductor chip and the cap, electrically connecting the semiconductor device can include providing a wire bond between the chip and the pad, and thermally connecting the semiconductor device can include providing the die attach between the chip and the cap.

The adhesive can contact the post, the base, the cap, the dielectric layer and the routing line, cover the substrate in the downward direction, cover and surround the post in the lateral directions and extend to peripheral edges of the assembly after the assembly is manufactured and detached from other assemblies in a batch.

The base can cover the semiconductor device, the post, the cap, the substrate and the adhesive in the downward direction, support the substrate and extend to peripheral edges of the assembly after the assembly is manufactured and detached from other assemblies in a batch.

The present invention has numerous advantages. The heat spreader can provide excellent heat spreading and heat dissipation without heat flow through the adhesive. As a result, the adhesive can be a low cost dielectric with low thermal conductivity and not prone to delamination. The post and the base can be integral with one another, thereby enhancing reliability. The cap can be customized for the semiconductor device, thereby enhancing the thermal connection. The adhesive can be sandwiched between the post and the substrate and between the base and the substrate, thereby providing a robust mechanical bond between the heat spreader and the substrate. The substrate can provide flexible multi-layer signal routing with complex circuitry patterns. The base can provide mechanical support for the substrate, thereby preventing warping. The assembly can be manufactured using low temperature processes which reduces stress and improves reliability. The assembly can also be manufactured using well-controlled processes which can be easily implemented by circuit board, lead frame and tape manufacturers.

These and other features and advantages of the present invention will be further described and more readily apparent from a review of the detailed description of the preferred embodiments which follows.

BRIEF DESCRIPTION OF THE DRAWINGS

The following detailed description of the preferred embodiments of the present invention can best be understood when read in conjunction with the following drawings, in which.

DETAILED DESCRIPTION OF THE INVENTION

Figure 1A:
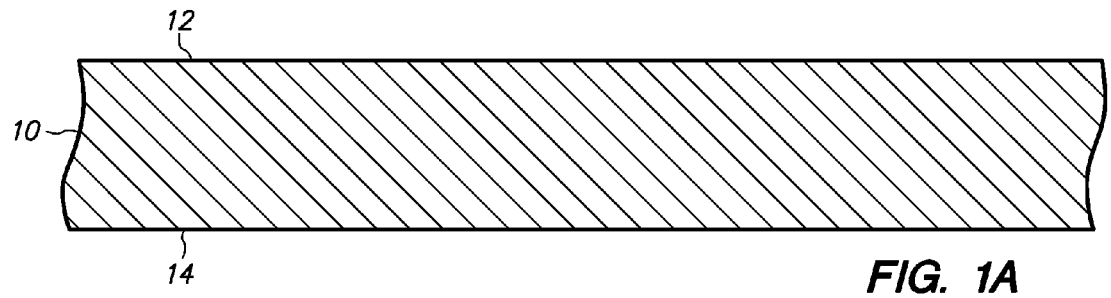
FIGS. 1A-1D are cross-sectional views showing a method of making a post and a base in accordance with an embodiment of the present invention.
Figure 1B:
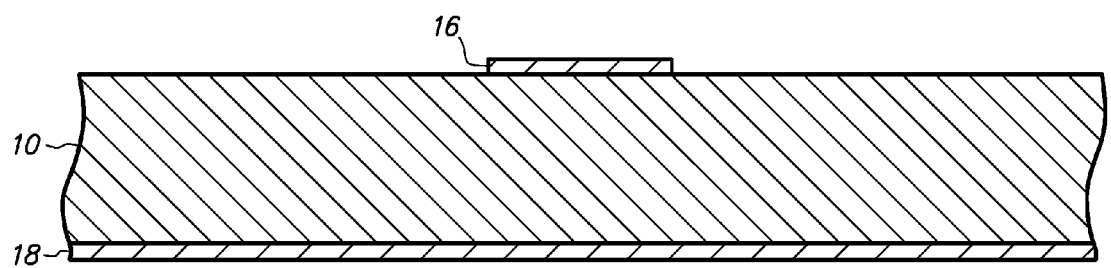
Figure 1C:
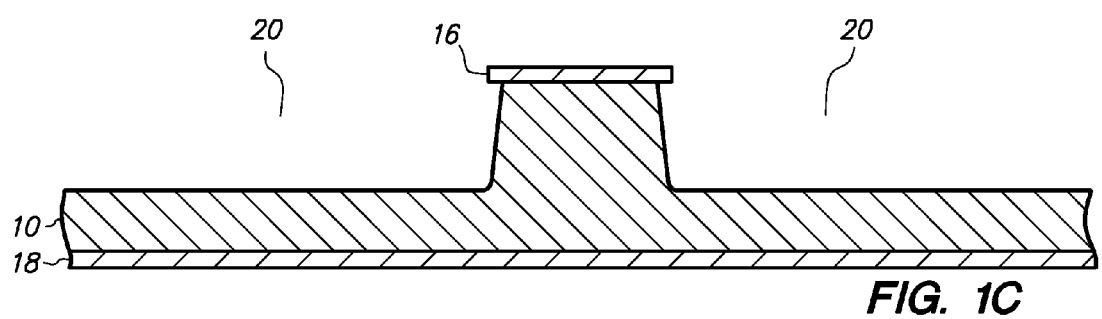
Figure 1D:
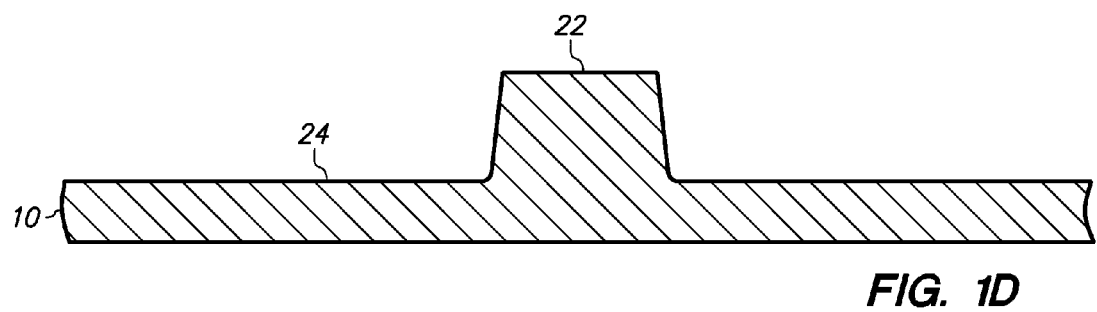
Figure 1E:
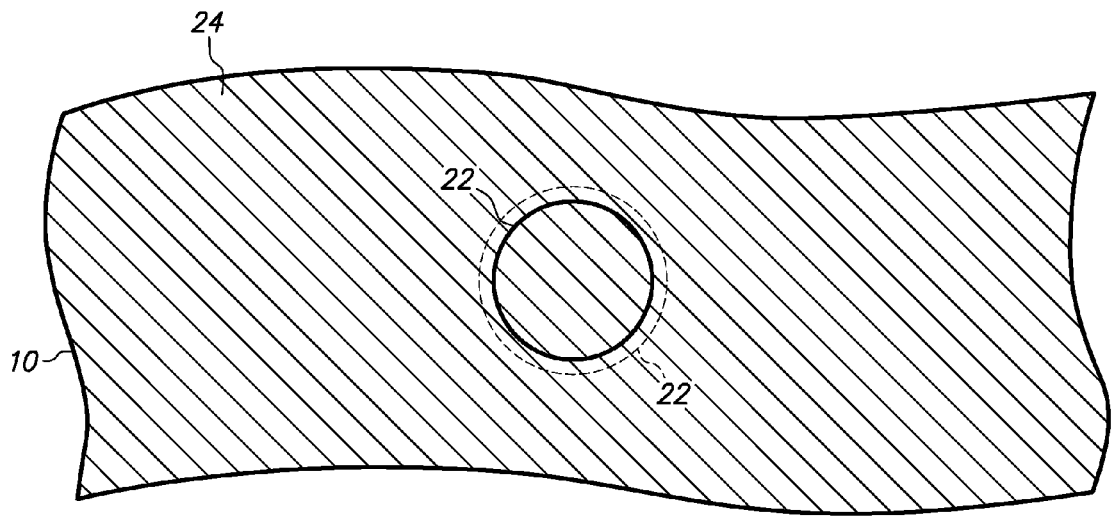
FIGS. 1E and 1F are top and bottom views, respectively, corresponding to FIG. 1D.
Figure 1F:
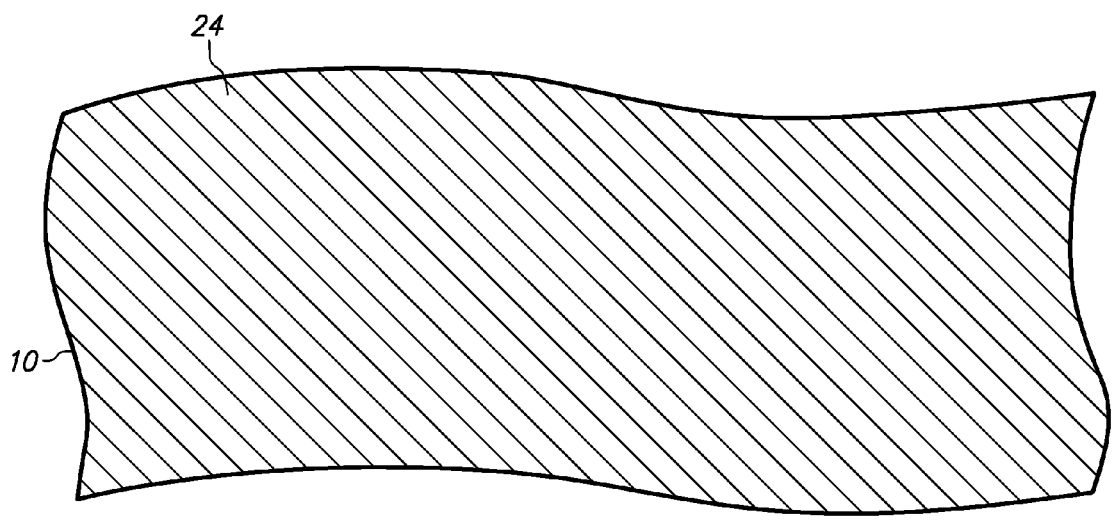

FIGS. 1A-1D are cross-sectional views showing a method of making a post and a base in accordance with an embodiment of the present invention, and FIGS. 1E and 1F are top and bottom views, respectively, corresponding to FIG. 1D.

FIG. 1A. is a cross-sectional view of metal plate 10 which includes opposing major surfaces 12 and 14. Metal plate 10 is illustrated as a copper plate with a thickness of 500 microns. Copper has high thermal conductivity, good bondability and low cost. Metal plate 10 can be various metals such as copper, aluminum, alloy 42, iron, nickel, silver, gold, combinations thereof, and alloys thereof.

FIG. 1B is a cross-sectional view of etch mask 16 and cover mask 18 formed on metal plate 10. Etch mask 16 and cover mask 18 are illustrated as photoresist layers which are deposited on metal plate 10 using dry film lamination in which hot rolls simultaneously press photoresist layers 16 and 18 onto surfaces 12 and 14, respectively. Wet spin coating and curtain coating are also suitable deposition techniques. A reticle (not shown) is positioned proximate to photoresist layer 16. Thereafter, photoresist layer 16 is patterned by selectively applying light through the reticle, applying a developer solution to remove the photoresist portion rendered soluble by the light and then hard baking, as is conventional. As a result, photoresist layer 16 has a pattern that selectively exposes surface 12, and photoresist layer 18 remains unpatterned and covers surface 14.

FIG. 1C is a cross-sectional view of recess 20 formed into but not through metal plate 10 by etching metal plate 10 in the pattern defined by etch mask 16. The etching is illustrated as a front-side wet chemical etch. A top spray nozzle (not shown) can spray the wet chemical etch on metal plate 10 while a bottom spray nozzle (not shown) is deactivated, or the structure can be dipped in the wet chemical etch since cover mask 18 provides back-side protection. The wet chemical etch is highly selective of copper and etches 300 microns into metal plate 10. As a result, recess 20 extends from surface 12 into but not through metal plate 10, is spaced from surface 14 by 200 microns and has a depth of 300 microns. The wet chemical etch also laterally undercuts metal plate 10 beneath etch mask 16. A suitable wet chemical etch can be provided by a solution containing alkaline ammonia or a dilute mixture of nitric and hydrochloric acid. Likewise, the wet chemical etch can be acidic or alkaline. The optimal etch time for forming recess 20 without excessively exposing metal plate 10 to the wet chemical etch can be established through trial and error.

FIGS. 1D, 1E and 1F are cross-sectional, top and bottom views, respectively, of metal plate 10 after etch mask 16 and cover mask 18 are removed. The photoresist layers are stripped using a solvent, such as a mild alkaline solution with a pH of 9, that is highly selective of photoresist with respect to copper.

Metal plate 10 as etched includes post 22 and base 24.

Post 22 is an unetched portion of metal plate 10 defined by etch mask 16. Post 22 is adjacent to and integral with and protrudes above base 24 and is laterally surrounded by recess 20. Post 22 has a height of 300 microns (recess 20 depth), a diameter at its top surface (circular portion of surface 12) of 1000 microns and a diameter at its bottom (circular portion adjacent to base 24) of 1100 microns. Thus, post 22 has a cut-off conical shape (resembling a frustum) with tapered sidewalls in which its diameter decreases as it extends upwardly from base 24 to its flat circular top surface. The tapered sidewalls arise from the lateral undercutting by the wet chemical etch beneath etch mask 16. The top surface is concentrically disposed within a periphery of the bottom (shown in phantom in FIG. 1E).

Base 24 is an unetched portion of metal plate 10 that is below post 22, extends laterally from post 22 in a lateral plane (with lateral directions such as left and right) and has a thickness of 200 microns (500−300).

Post 22 and base 24 can be treated to improve bondability to epoxy and solder. For instance, post 22 and base 24 can be chemically oxidized or microetched to provide rougher surfaces.

Post 22 and base 24 are illustrated as a subtractively formed single-piece metal (copper). Post 22 and base 24 can also be a stamped single-piece metal formed by stamping metal plate 10 with a contact piece with a recess or hole that defines post 22. Post 22 can also be formed additively, for instance by depositing post 22 on base 24 using electroplating, chemical vapor deposition (CVD), physical vapor deposition (PVD) and so on, or semi-additively, for instance by depositing an upper portion of post 22 on an etch-defined lower portion of post 22. Post 22 can also be sintered to base 24. Post 22 and base 24 can also be a multi-piece metal, for instance by electroplating a solder post 22 on a copper base 24, in which case post 22 and base 24 have a metallurgical interface and are adjacent to but not integral with one another.

Figure 2A:
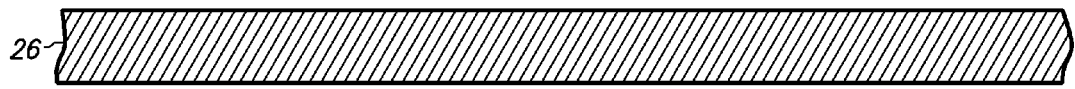
FIGS. 2A and 2B are cross-sectional views showing a method of making an adhesive in accordance with an embodiment of the present invention.
Figure 2B:
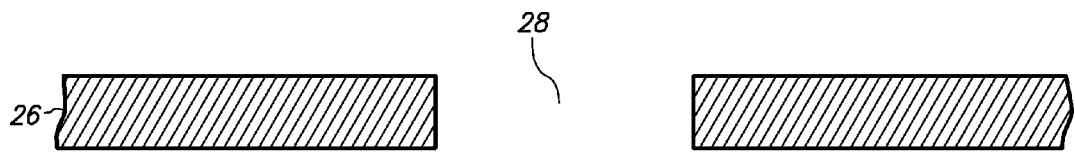
Figure 2C:
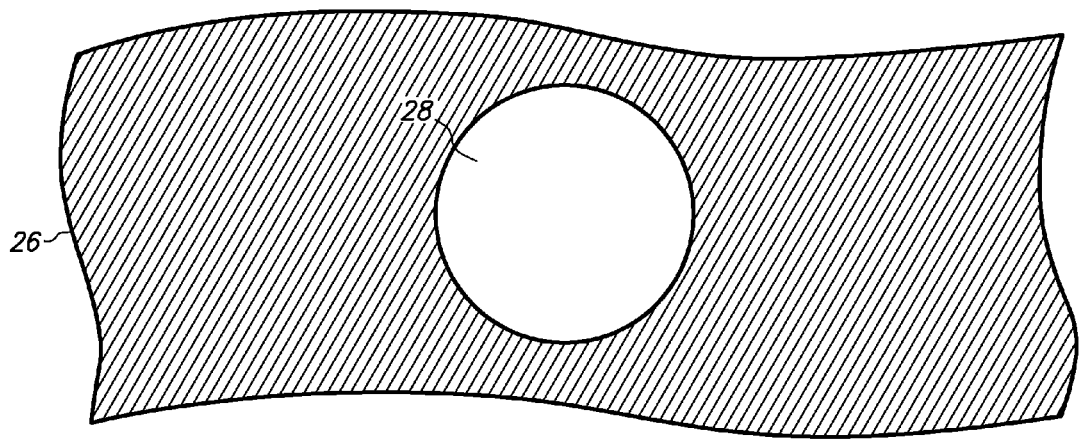
FIGS. 2C and 2D are top and bottom views, respectively, corresponding to FIG. 2B.
Figure 2D:
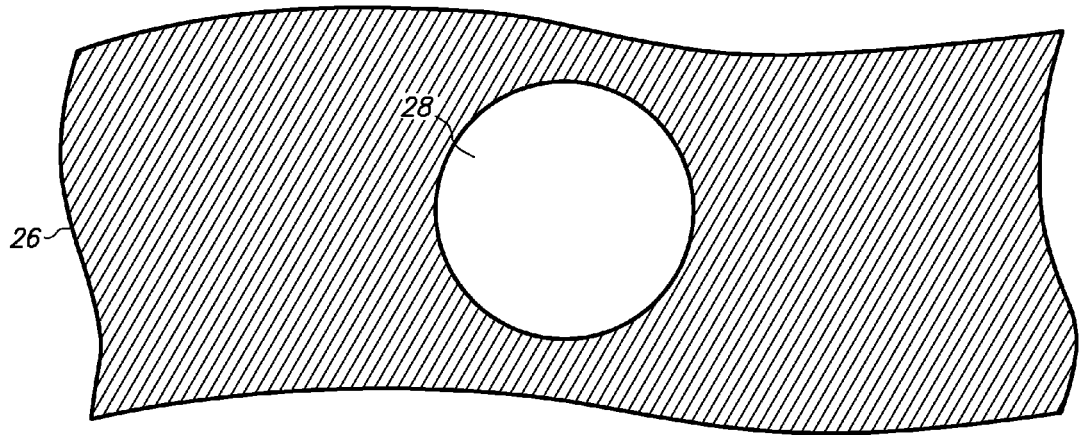

FIGS. 2A and 2B are cross-sectional views showing a method of making an adhesive in accordance with an embodiment of the present invention, and FIGS. 2C and 2D are top and bottom views, respectively, corresponding to FIG. 2B.

FIG. 2A is a cross-sectional view of adhesive 26. Adhesive 26 is illustrated as a prepreg with B-stage uncured epoxy and a thickness of 150 microns.

Adhesive 26 can be various dielectric films or prepregs formed from numerous organic or inorganic electrical insulators. For instance, adhesive 26 can initially be a prepreg in which thermosetting epoxy in resin form impregnates a reinforcement and is partially cured to an intermediate stage. The epoxy can be FR-4 although other epoxies such as polyfunctional and bismaleimide triazine (BT) are suitable. For specific applications, cyanate esters, polyimide and PTFE are also suitable. The reinforcement can be E-glass although other reinforcements such as S-glass, D-glass, quartz, kevlar aramid and paper are suitable. The reinforcement can also be woven, non-woven or random microfiber. A filler such as silica (powdered fused quartz) can be added to the prepreg to improve thermal conductivity, thermal shock resistance and thermal expansion matching. Commercially available prepregs such as SPEEDBOARD C prepreg by W.L. Gore & Associates of Eau Claire, Wis. are suitable.

FIGS. 2B, 2C and 2D are cross-sectional, top and bottom views, respectively, of adhesive 26 with opening 28. Opening 28 is a central window that extends through adhesive 26. Opening 28 is formed by mechanical drilling through the prepreg and has a diameter of 1150 microns. Opening 28 can be formed by other techniques such as punching and stamping.

Figure 3A:
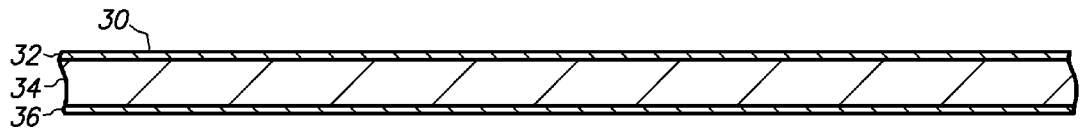
FIGS. 3A-3G are cross-sectional views showing a method of making a substrate in accordance with an embodiment of the present invention.
Figure 3B:
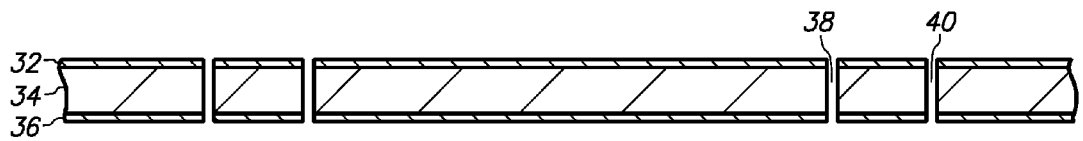
Figure 3C:
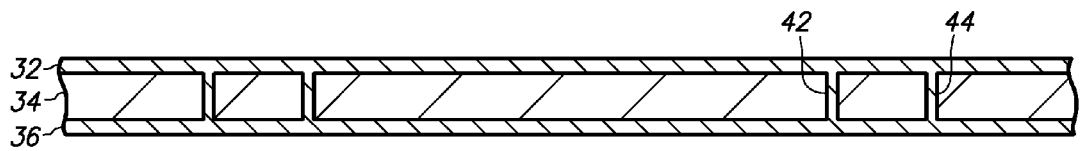
Figure 3D:
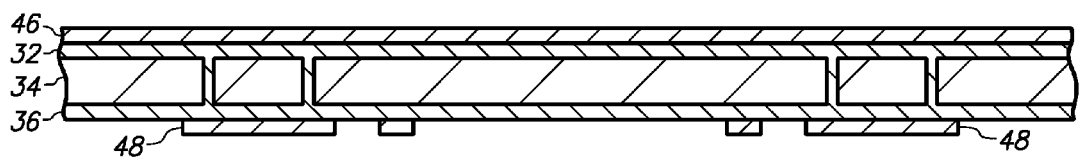
Figure 3E:
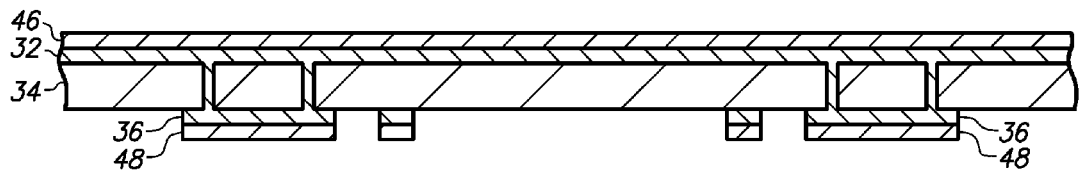
Figure 3F:
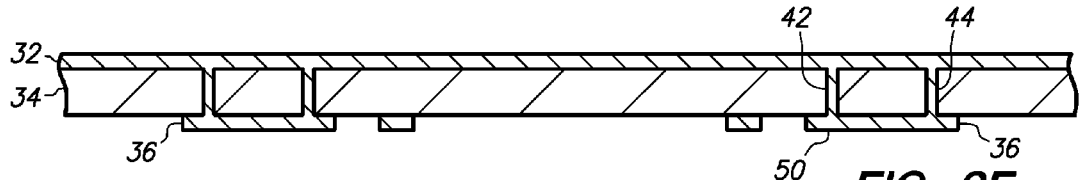
Figure 3G:
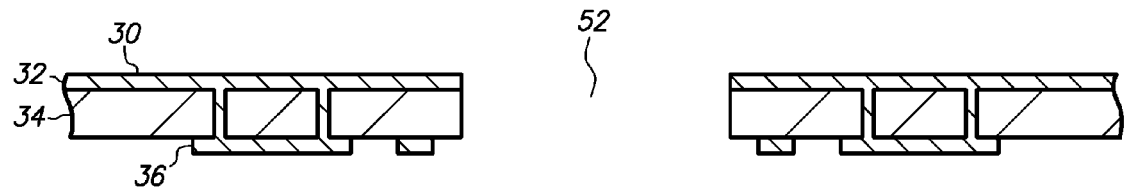
Figure 3H:
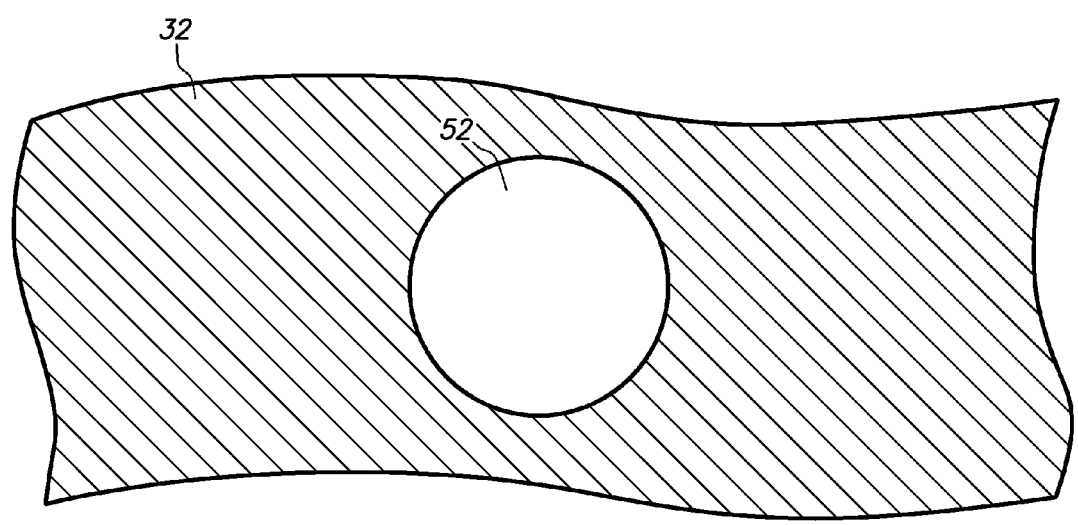
FIGS. 3H and 3I are top and bottom views, respectively, corresponding to FIG. 3G.
Figure 3I:
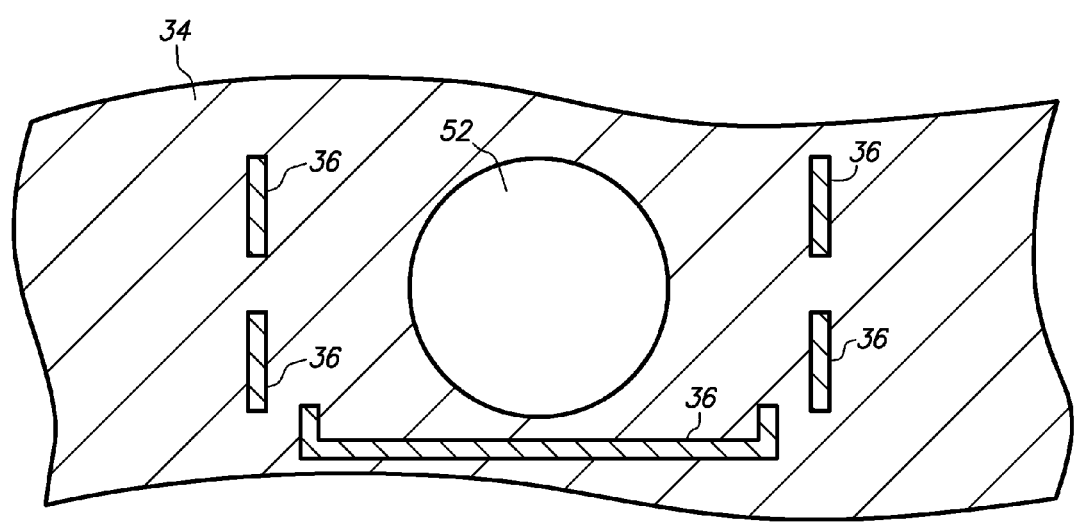

FIGS. 3A-3G are cross-sectional views showing a method of making a substrate in accordance with an embodiment of the present invention, and FIGS. 3H and 3I are top and bottom views, respectively, corresponding to FIG. 3G.

FIG. 3A is a cross-sectional view of substrate 30 that includes first conductive layer 32, dielectric layer 34 and second conductive layer 36. First conductive layer 32 contacts and extends above dielectric layer 34, second conductive layer 36 contacts and extends below dielectric layer 34, and dielectric layer 34 contacts and is sandwiched between and is laminated to conductive layers 32 and 36. Conductive layers 32 and 36 are electrical conductors and dielectric layer 34 is an electrical insulator. For instance, conductive layers 32 and 36 are unpatterned copper sheets with a thickness of 15 microns, and dielectric layer 34 is epoxy with a thickness of 150 microns.

FIG. 3B is a cross-sectional view of substrate 30 with holes 38 and 40 that each extend through conductive layers 32 and 36 and dielectric layer 34. Holes 38 and 40 are formed by mechanical drilling although other techniques such as laser drilling are suitable.

FIG. 3C is a cross-sectional view of substrate 30 with vias 42 and 44 in holes 38 and 40, respectively. Vias 42 and 44 are electrical conductors that contact and electrically connect conductive layers 32 and 36, and contact and extend through dielectric layer 34. Vias 42 and 44 are illustrated as plated through-holes. For instance, the structure is dipped in an activator solution to render dielectric layer 34 at the sidewalls of holes 38 and 40 catalytic to electroless copper, then a first copper layer is electrolessly plated on conductive layers 32 and 36 and the sidewalls of holes 38 and 40, and then a second copper layer is electroplated on the first copper layer. The first copper layer has a thickness of 2 microns, the second copper layer has a thickness of 13 microns, and the plated copper layer has a thickness of 15 microns. As a result, conductive layers 32 and 36 essentially grow and have a thickness of 40 microns (25+15), which is subsequently reduced to 30 microns due to photoresist stripping, cleaning and so on. Furthermore, vias 42 and 44 are formed in holes 38 and 40, respectively. Conductive layers 32 and 36 and vias 42 and 44 are shown and described as a single layer for convenience of illustration. Likewise, vias 42 and 44 are shown as posts that fill holes 38 and 40 rather than as hollow tubes for convenience of illustration.

FIG. 3D is a cross-sectional view of substrate 30 with cover mask 46 and etch mask 48 formed on conductive layers 32 and 36, respectively. Cover mask 46 and etch mask 48 are illustrated as photoresist layers similar to photoresist layers 18 and 16, respectively. Photoresist layer 46 remains unpatterned and covers first conductive layer 32, and photoresist layer 48 has a pattern that selectively exposes second conductive layer 36.

FIG. 3E is a cross-sectional view of substrate 30 with selected portions of second conductive layer 36 removed by etching second conductive layer 36 into a patterned layer defined by etch mask 48. The etching is a back-side wet chemical etch similar to the etch applied to metal plate 10. First conductive layer 32 remains an unpatterned copper sheet, however the etch etches through second conductive layer 36 to expose dielectric layer 34 and converts second conductive layer 36 from an unpatterned into a patterned layer.

Second conductive layer 36 is shown below dielectric layer 34 to retain a single orientation throughout the figures for ease of comparison between the figures, although in this step the structure may be inverted so that gravity assists the etching.

FIG. 3F is a cross-sectional view of substrate 30 after cover mask 46 and etch mask 48 are removed. Photoresist layers 46 and 48 can be stripped in the same manner as photoresist layers 16 and 18.

Second conductive layer 36 as etched includes routing line 50. Thus, routing line 50 is an unetched portion of second conductive layer 36 defined by etch mask 48. Furthermore, routing line 50 is a copper trace that contacts and extends below dielectric layer 34 and is adjacent to and electrically connected to vias 42 and 44. Thus, vias 42 and 44 each extend between and electrically connect first conductive layer 32 and routing line 50.

FIGS. 3G, 3H and 3I are cross-sectional, top and bottom views, respectively, of substrate 30 with aperture 52. Aperture 52 is a central window that extends through substrate 30. Aperture 52 is formed by mechanical drilling through first conductive layer 32 and dielectric layer 34 (but not second conductive layer 36 since it was previously removed from this region by the wet chemical etch) and has a diameter of 1150 microns. Aperture 52 can be formed with other techniques such as punching and stamping. Preferably, opening 28 and aperture 52 have the same diameter and are formed in the same manner with the same drill bit at the same drilling station.

Substrate 30 is illustrated as a laminated structure. Substrate 30 can be other multi-layer electrical interconnects such as a ceramic board or a printed circuit board. Likewise, substrate 30 can include additional layers of embedded circuitry.

Figure 4A:
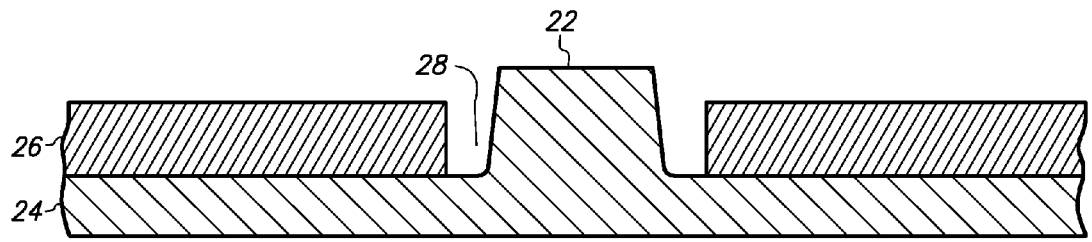
FIGS. 4A-4L are cross-sectional views showing a method of making a thermal board that includes the post, the base, the adhesive and the substrate in accordance with an embodiment of the present invention.
Figure 4B:
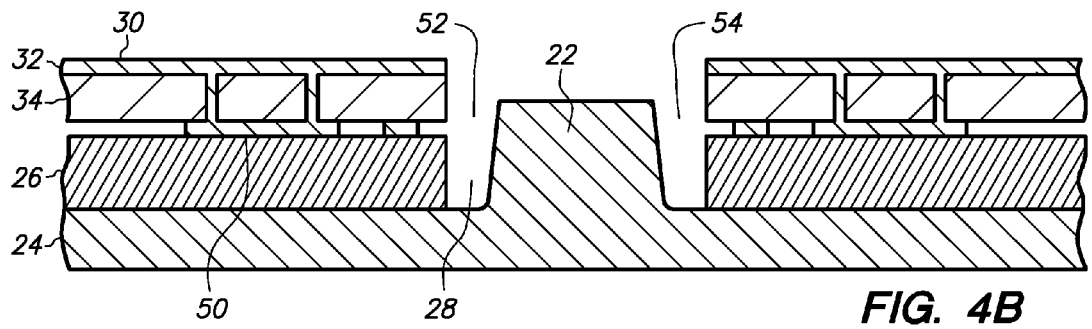
Figure 4C:
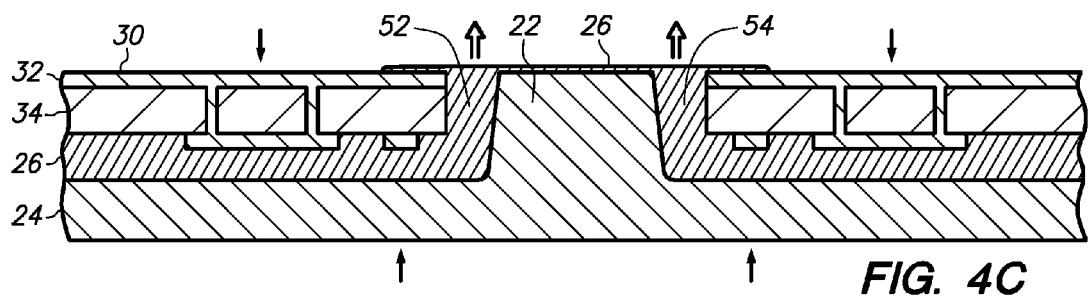
Figure 4D:
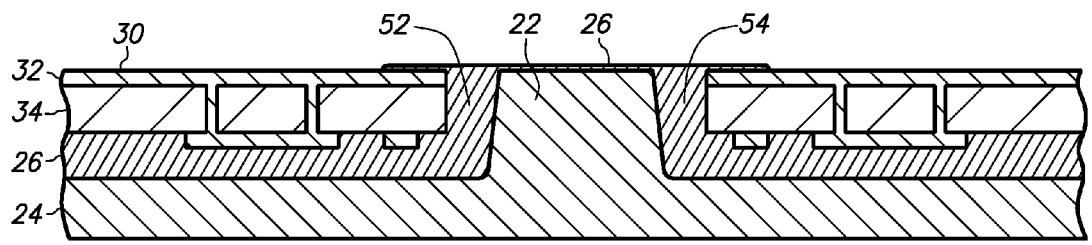
Figure 4E:
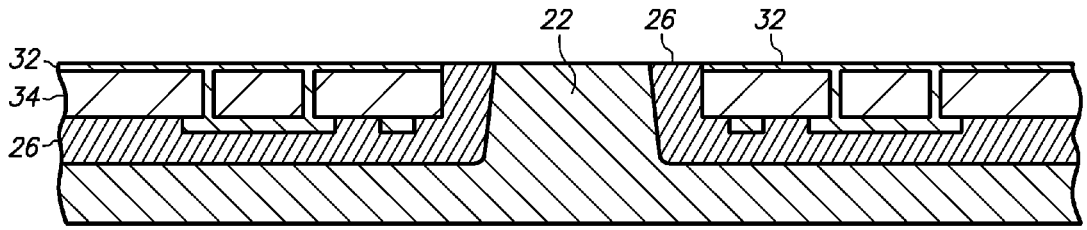
Figure 4F:
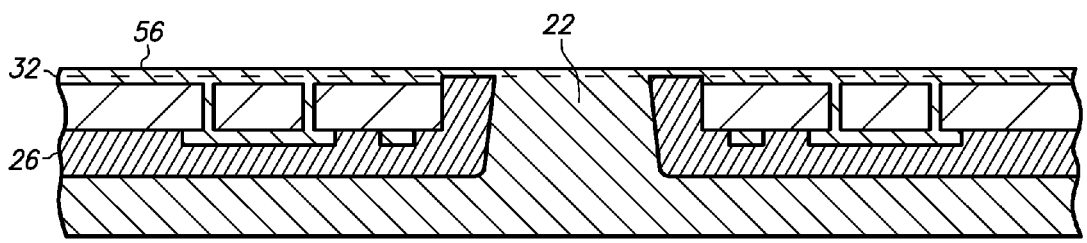
Figure 4G:
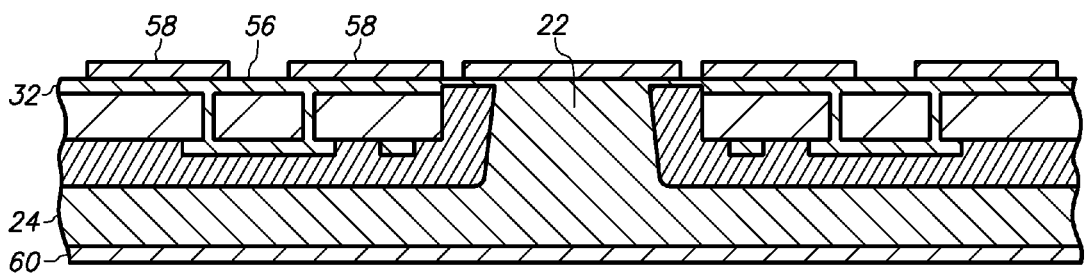
Figure 4H:
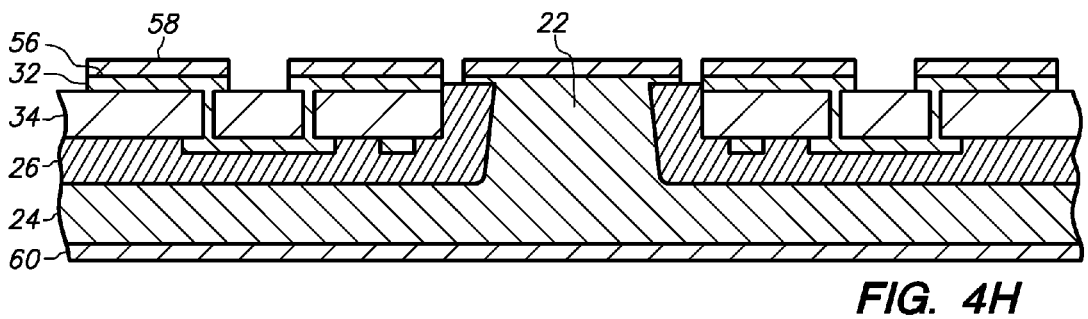
Figure 4I:
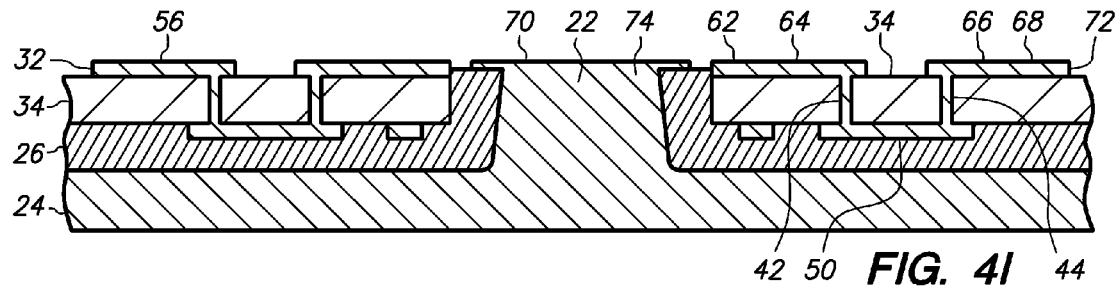
Figure 4J:
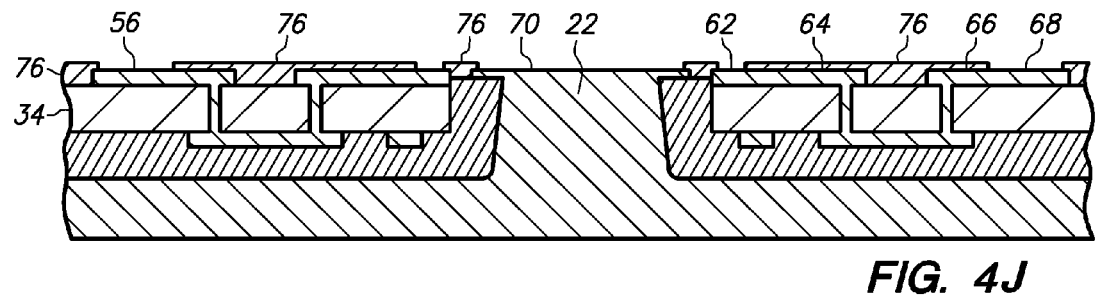
Figure 4K:
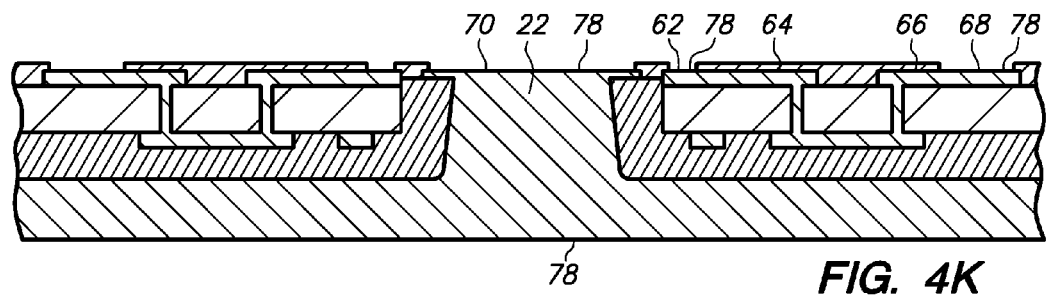
Figure 4L:
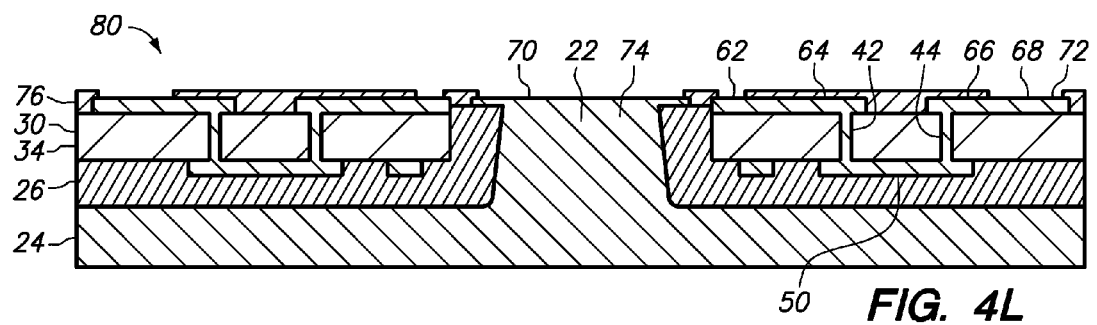
Figure 4M:
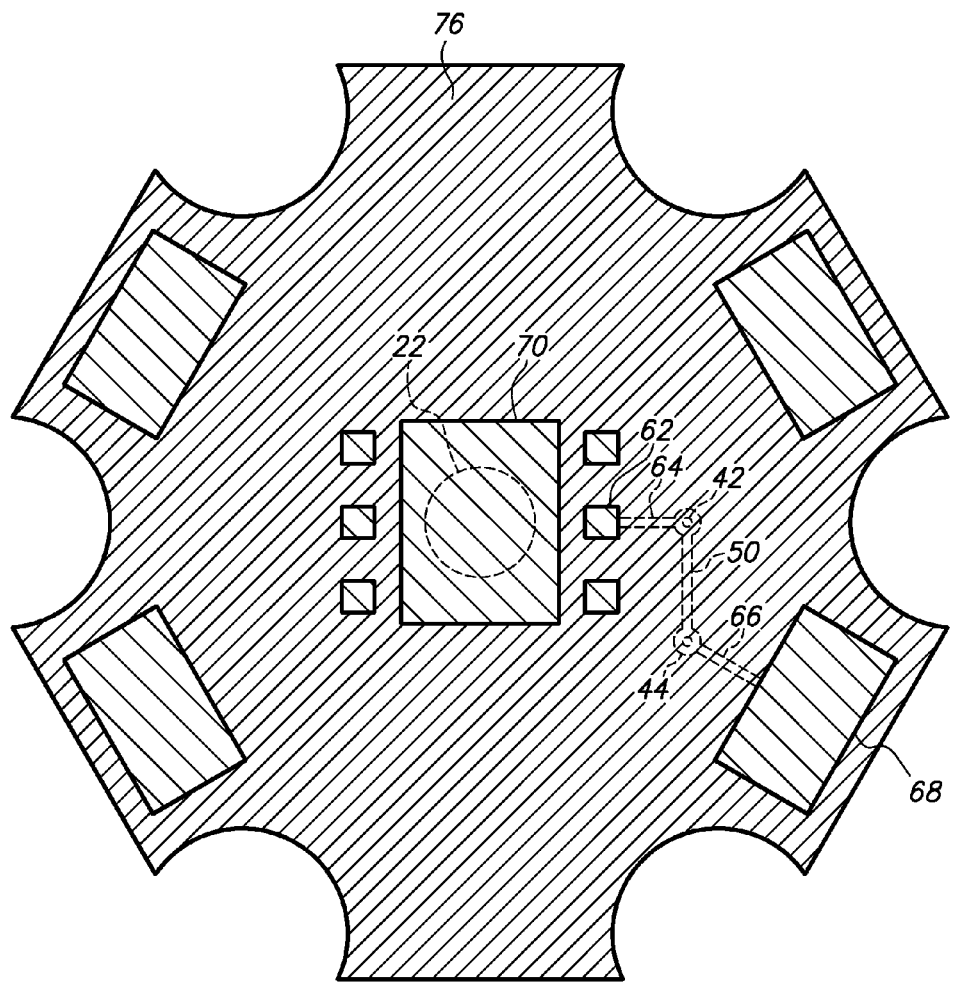
FIGS. 4M and 4N are top and bottom views, respectively, corresponding to FIG. 4L.
Figure 4N:
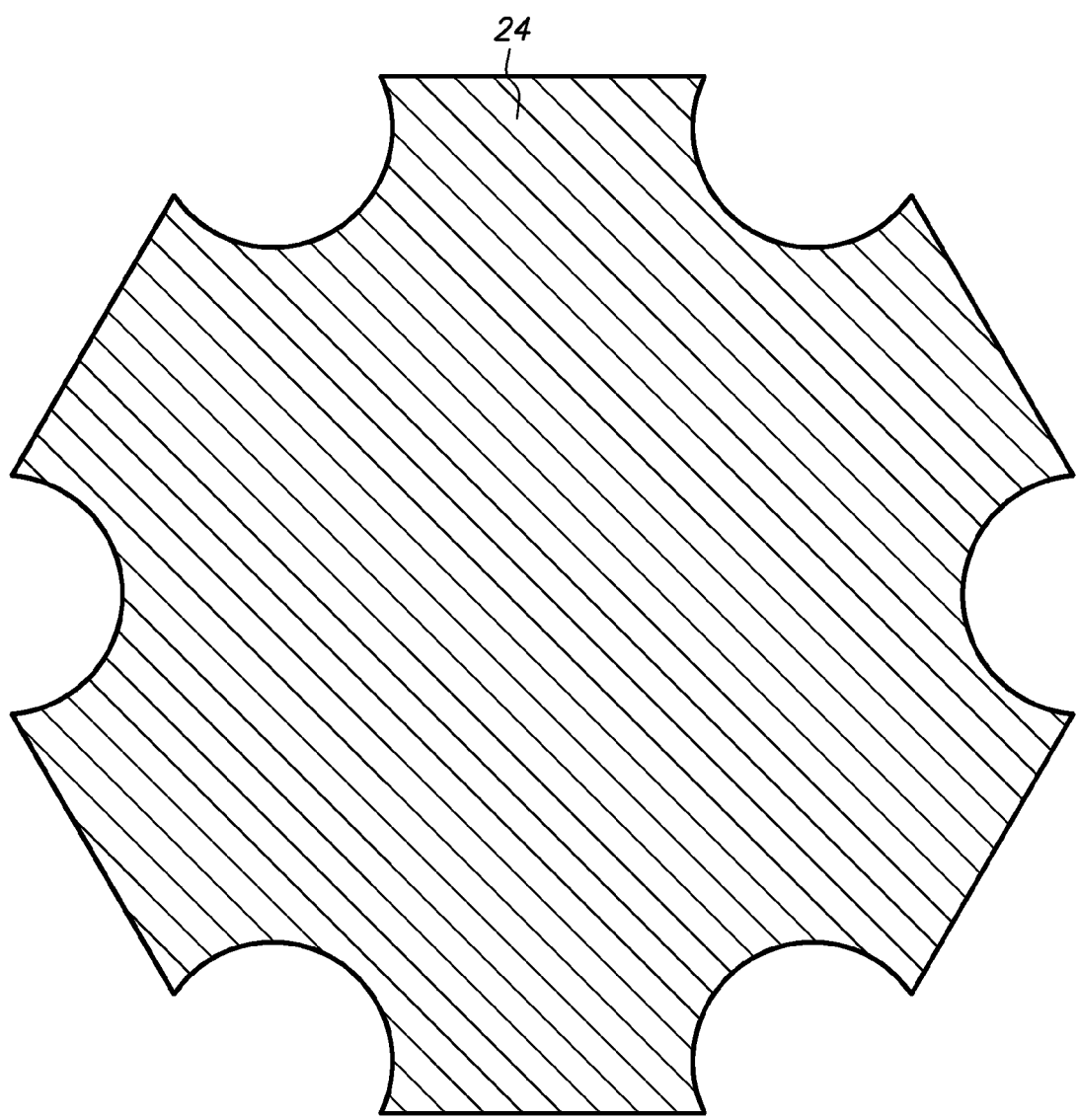

FIGS. 4A-4L are cross-sectional views showing a method of making a thermal board that includes post 22, base 24, adhesive 26 and substrate 30 in accordance with an embodiment of the present invention, and FIGS. 4M and 4N are top and bottom views, respectively, corresponding to FIG. 4L.

FIG. 4A is a cross-sectional view of the structure with adhesive 26 mounted on base 24. Adhesive 26 is mounted by lowering it onto base 24 as post 22 is inserted into and through and upwards in opening 28. Adhesive 26 eventually contacts and rests on base 24. Preferably, post 22 is inserted into and extends though opening 28 without contacting adhesive 26 and is centrally located within opening 28.

FIG. 4B is a cross-sectional view of the structure with substrate 30 mounted on adhesive 26. Substrate 30 is mounted by lowering it onto adhesive 26 as post 22 is inserted into and upwards in aperture 52. Substrate 30 eventually contacts and rests on adhesive 26. Preferably, post 22 is inserted into but not through aperture 52 without contacting substrate 30 and is centrally located within aperture 52. As a result, gap 54 is located in aperture 52 between post 22 and substrate 30. Gap 54 laterally surrounds post 22 and is laterally surrounded by substrate 30. In addition, opening 28 and aperture 52 are precisely aligned with one another and have the same diameter.

At this stage, substrate 30 is mounted on and contacts and extends above adhesive 26. Post 22 extends through opening 28 into aperture 52 to dielectric layer 34, is 60 microns below the top surface of first conductive layer 32 and is exposed through aperture 52 in the upward direction. Adhesive 26 contacts and is sandwiched between base 24 and substrate 30 but is spaced from dielectric layer 34 and remains a non-solidified prepreg with B-stage uncured epoxy, and gap 54 is filled with air.

FIG. 4C is a cross-sectional view of the structure with adhesive 26 in gap 54. Adhesive 26 is flowed into gap 54 by applying heat and pressure. In this illustration, adhesive 26 is forced into gap 54 by applying downward pressure to first conductive layer 32 and/or upward pressure to base 24, thereby moving base 24 and substrate 30 towards one another and applying pressure to adhesive 26 while simultaneously applying heat to adhesive 26. Adhesive 26 becomes compliant enough under the heat and pressure to conform to virtually any shape. As a result, adhesive 26 sandwiched between base 24 and substrate 30 is compressed, forced out of its original shape and flows into and upward in gap 54. Base 24 and substrate 30 continue to move towards one another and adhesive 26 eventually fills gap 54. Moreover, adhesive 26 remains sandwiched between and continues to fill the reduced space between base 24 and substrate 30.

For instance, base 24 and first conductive layer 32 can be disposed between top and bottom platens (not shown) of a press. In addition, a top cull plate and top buffer paper (not shown) can be sandwiched between first conductive layer 32 and the top platen, and a bottom cull plate and bottom buffer paper (not shown) can be sandwiched between base 24 and the bottom platen. The stack includes the top platen, top cull plate, top buffer paper, substrate 30, adhesive 26, base 24, bottom buffer paper, bottom cull plate and bottom platen in descending order. Furthermore, the stack may be positioned on the bottom platen by tooling pins (not shown) that extend upward from the bottom platen through registration holes (not shown) in base 24.

The platens are heated and move towards one another, thereby applying heat and pressure to adhesive 26. The cull plates disperse the heat from the platens so that it is more uniformly applied to base 24 and substrate 30 and thus adhesive 26, and the buffer papers disperse the pressure from the platens so that it is more uniformly applied to base 24 and substrate 30 and thus adhesive 26. Initially, second conductive layer 36 is tunnels into and becomes embedded in adhesive 26. As this occurs, dielectric layer 34 contacts and presses down on adhesive 26. As the platen motion and heat continue, adhesive 26 between base 24 and substrate 30 is compressed, melted and flows into and upward in gap 54 and across dielectric layer 34 to first conductive layer 32. For instance, the uncured epoxy is melted by the heat and the molten uncured epoxy is squeezed by the pressure into gap 54, however the reinforcement and the filler remain between base 24 and substrate 30. Adhesive 26 elevates more rapidly than post 22 in aperture 52 and fills gap 54. Adhesive 26 also rises slightly above gap 54 and overflows onto the top surfaces of post 22 and first conductive layer 32 adjacent to gap 54 before the platen motion stops. This may occur due to the prepreg being slightly thicker than necessary. As a result, adhesive 26 creates a thin coating on the top surface of post 22. The platen motion is eventually blocked by post 22 and the platens become stationary but continue to apply heat to adhesive 26.

The upward flow of adhesive 26 in gap 54 is shown by the thick upward arrows, the upward motion of post 22 and base 24 relative to substrate 30 is shown by the thin upward arrows, and the downward motion of substrate 30 relative to post 22 and base 24 is shown by the thin downward arrows.

FIG. 4D is a cross-sectional view of the structure with adhesive 26 solidified.

For instance, the platens continue to clamp post 22 and base 24 and apply heat after the platen motion stops, thereby converting the B-stage molten uncured epoxy into C-stage cured or hardened epoxy. Thus, the epoxy is cured in a manner similar to conventional multi-layer lamination. After the epoxy is cured, the platens move away from one another and the structure is released from the press.

Adhesive 26 as solidified provides a secure robust mechanical bond between post 22 and substrate 30 as well as between base 24 and substrate 30. Adhesive 26 can withstand normal operating pressure without distortion or damage and is only temporarily distorted under unusually high pressure. Furthermore, adhesive 26 can absorb thermal expansion mismatch between post 22 and substrate 30 and between base 24 and substrate 30.

At this stage, post 22 and first conductive layer 32 are essentially coplanar with one another and adhesive 26 and first conductive layer 32 extend to a top surface that faces in the upward direction. For instance, adhesive 26 between base 24 and second conductive layer 36 has a thickness of 90 microns which is 60 microns less than its initial thickness of 150 microns, post 22 ascends 60 microns in aperture 52 and substrate 30 descends 60 microns relative to post 22. The 300 micron height of post 22 is essentially the same as the combined height of first conductive layer 32 (30 microns), dielectric layer 34 (150 microns), second conductive layer 36 (30 microns) and the underlying adhesive 26 (90 microns). Furthermore, post 22 continues to be centrally located in opening 28 and aperture 52 and spaced from substrate 30, and adhesive 26 fills the space between base 24 and substrate 30 and fills gap 54. For instance, gap 54 (as well as adhesive 26 between post 22 and substrate 30) has a width of 75 microns ((1150−1000)/2) at the top surface of post 22. Adhesive 26 extends across dielectric layer 34 in gap 54. That is, adhesive 26 in gap 54 extends in the upward and downward directions across the thickness of dielectric layer 34 at the outer sidewall of gap 54. Adhesive 26 also includes a thin top portion above gap 54 that contacts the top surfaces of post 22 and first conductive layer 32 and extends above post 22 by 10 microns.

FIG. 4E is a cross-sectional view of the structure after upper portions of post 22, adhesive 26 and first conductive layer 32 are removed.

Post 22, adhesive 26 and first conductive layer 32 have their upper portions removed by grinding. For instance, a rotating diamond sand wheel and distilled water are applied to the top of the structure. Initially, the diamond sand wheel grinds only adhesive 26. As the grinding continues, adhesive 26 becomes thinner as its grinded surface migrates downwardly. Eventually the diamond sand wheel contacts post 22 and first conductive layer 32 (not necessarily at the same time), and as a result, begins to grind post 22 and first conductive layer 32 as well. As the grinding continues, post 22, adhesive 26 and first conductive layer 32 become thinner as their grinded surfaces migrate downwardly. The grinding continues until the desired thickness has been removed. Thereafter, the structure is rinsed in distilled water to remove contaminants.

The grinding removes a 25 micron thick upper portion of adhesive 26, a 15 micron thick upper portion of post 22 and a 15 micron thick upper portion of first conductive layer 32. The decreased thickness does not appreciably affect post 22 or adhesive 26. However, it substantially reduces the thickness of first conductive layer 32 from 30 microns to 15 microns.

At this stage, post 22, adhesive 26 and first conductive layer 32 are coplanar with one another at a smoothed lapped lateral top surface that is above dielectric layer 34 and faces in the upward direction.

FIG. 4F is a cross-sectional view of the structure with third conductive layer 56 deposited on post 22, adhesive 26 and first conductive layer 32.

Third conductive layer 56 contacts post 22, adhesive 26 and first conductive layer 32 and covers them in the upward direction. For instance, the structure is dipped in an activator solution to render adhesive 26 catalytic to electroless copper, then a first copper layer is electrolessly plated on post 22, adhesive 26 and first conductive layer 32, and then a second copper layer is electroplated on the first copper layer. The first copper layer has a thickness of 2 microns, the second copper layer has a thickness of 13 microns, and third conductive layer 56 has a thickness of 15 microns. As a result, first conductive layer 32 essentially grows and has a thickness of 30 microns (15+15). Thus, third conductive layer 56 serves as a cover layer for post 22 and a build-up layer for first conductive layer 32. Post 22 and third conductive layer 56, and conductive layers 32 and 56 are shown as a single layer for convenience of illustration. The boundary (shown in phantom) between post 22 and third conductive layer 56 and between conductive layers 32 and 56 may be difficult or impossible to detect since copper is plated on copper. However, the boundary between adhesive 26 and third conductive layer 56 is clear.

FIG. 4G is a cross-sectional view of the structure with etch mask 58 and cover mask 60 formed on the top and bottom surfaces, respectively, of the structure. Etch mask 58 and cover mask 60 are illustrated as photoresist layers similar to photoresist layers 16 and 18, respectively. Photoresist layer 58 has a pattern that selectively exposes third conductive layer 56, and photoresist layer 60 remains unpatterned and covers base 24.

FIG. 4H is a cross-sectional view of the structure with selected portions of conductive layers 32 and 56 removed by etching conductive layers 32 and 56 in the pattern defined by etch mask 58. The etching is a front-side wet chemical etch similar to the etch applied to metal plate 10. The wet chemical etch etches through conductive layers 32 and 56 to expose adhesive 26 and dielectric layer 34 and converts conductive layers 32 and 56 from unpatterned into patterned layers, and base 24 remains unpatterned.

FIG. 4I is a cross-sectional view of the structure after etch mask 58 and cover mask 60 are removed. Photoresist layers 58 and 60 can be stripped in the same manner as photoresist layers 16 and 18.

Conductive layers 32 and 56 as etched include pad 62, routing lines 64 and 66 and terminal 68, and conductive layer 56 as etched includes cap 70. Pad 62, routing lines 64 and 66 and terminal 68 are unetched portions of conductive layers 32 and 56 defined by etch mask 58, and cap 70 is an unetched portion of conductive layer 56 defined by etch mask 58. Thus, conductive layers 32 and 56 are a patterned layer that includes pad 62, routing lines 64 and 66 and terminal 68 and excludes cap 70. Furthermore, routing line 64 is a copper trace that contacts and extends above dielectric layer 34 and is adjacent to and electrically connects via 42 and pad 62, and routing line 66 is a copper trace that contacts and extends above dielectric layer 34 and is adjacent to and electrically connects via 44 and terminal 68.

Conductive trace 72 is provided by vias 42 and 44, routing lines 50, 64 and 66, pad 62 and terminal 68. Similarly, an electrically conductive path between pad 62 and terminal 68 is in sequence routing line 64, via 42, routing line 50, via 44 and routing line 66 (and vice-versa). Conductive trace 72 provides horizontal (lateral) fan-out routing from pad 62 to terminal 68. Conductive trace 72 is not be limited to this configuration. For instance, pad 62 and terminal 68 can be formed directly above vias 42 and 44, respectively, thereby eliminating the need for routing lines 64 and 66, respectively. Furthermore, the electrically conductive path can include additional vias and routing lines (in the first, second and/or additional conductive layers) as well as passive components such as resistors and capacitors mounted on additional pads.

Heat spreader 74 includes post 22, base 24 and cap 70. Post 22 and base 24 are integral with one another. Cap 70 is above and adjacent to and covers in the upward direction and extends laterally in the lateral directions from the top of post 22. Cap 70 is positioned so that post 22 is centrally located within its periphery. Cap 70 also contacts the underlying portion of adhesive 26 that is coplanar with and adjacent to and laterally surrounds post 22 and covers this portion in the upward direction.

Heat spreader 74 is essentially a heat slug with an inverted T-like shape that includes a pedestal (post 22), wings (base 24 portions that extend laterally from the pedestal) and a thermal pad (cap 70).

FIG. 4J is a cross-sectional view of the structure with solder mask 76 formed on dielectric layer 34, third conductive layer 56 and cap 70.

Solder mask 76 is an electrically insulative layer that is selectively patterned to expose pad 62, terminal 68 and cap 70 and cover routing lines 64 and 66 and the exposed portions of dielectric layer 34 in the upward direction. Solder mask 76 has a thickness of 25 microns above pad 62 and terminal 68 and extends 55 microns (30+25) above dielectric layer 34.

Solder mask 76 can initially be a photoimageable liquid resin that is dispensed on the structure. Thereafter, solder mask 76 is patterned by selectively applying light through a reticle (not shown), applying a developer solution to remove the solder mask portions rendered soluble by the light and then hard baking, as is conventional.

FIG. 4K is a cross-sectional view of the structure with plated contacts 78 formed on base 24, pad 62, terminal 68 and cap 70.

Plated contacts 78 are thin spot plated metal coatings that contact base 24 and cover it in the downward direction and contact pad 62, terminal 68 and cap 70 and cover their exposed portions in the upward direction. For instance, a nickel layer is electrolessly plated on base 24, pad 62, terminal 68 and cap 70, and then a gold layer is electrolessly plated on the nickel layer. The buried nickel layer has a thickness of 3 microns, the gold surface layer has a thickness of 0.5 microns, and plated contacts 78 have a thickness of 3.5 microns.

Base 24, pad 62, terminal 68 and cap 70 treated with plated contacts 78 as a surface finish have several advantages. The buried nickel layer provides the primary mechanical and electrical and/or thermal connection, and the gold surface layer provides a wettable surface to facilitate solder reflow. Plated contacts 78 also protect base 24, pad 62, terminal 68 and cap 70 from corrosion. Plated contacts 78 can include a wide variety of metals to accommodate the external connection media. For instance, a silver surface layer plated on a buried nickel layer can accommodate a solder joint or a wire bond.

Base 24, pad 62, terminal 68 and cap 70 treated with plated contacts 78 are shown as single layers for convenience of illustration. The boundary (not shown) with plated contacts 78 in base 24, pad 62, terminal 68 and cap 70 occurs at the copper/nickel interface.

At this stage, the manufacture of thermal board 80 can be considered complete.

FIGS. 4L, 4M and 4N are cross-sectional, top and bottom views, respectively, of thermal board 80 after it is detached at peripheral edges along cut lines from a support frame and/or adjacent thermal boards in a batch.

Thermal board 80 includes adhesive 26, substrate 30, heat spreader 74 and solder mask 76. Substrate 30 includes dielectric layer 34 and conductive trace 72 which includes vias 42 and 44, routing lines 50, 64 and 66, pad 62 and terminal 68. Heat spreader 74 includes post 22, base 24 and cap 70.

Post 22 extends through opening 28 and into aperture 52, remains centrally located within opening 28 and aperture 52 and is coplanar with an adjacent portion of adhesive 26 above dielectric layer 34. Post 22 retains its cut-off conical shape with tapered sidewalls in which its diameter decreases as it extends upwardly from base 24 to its flat circular top adjacent to cap 70. Base 24 covers post 22, adhesive 26, substrate 30, cap 70, conductive trace 72 and solder mask 76 in the downward direction and extends to the peripheral edges of thermal board 80. Cap 70 is above and adjacent to and thermally connected to post 22, covers the top of post 22 in the upward direction and laterally extends from the top of post 22 in the lateral directions. Cap 70 also contacts and covers in the upward direction a portion of adhesive 26 that is coplanar with and adjacent to and laterally surrounds post 22. Cap 70 is also coplanar with pad 62 and terminal 68.

Adhesive 26 is mounted on and extends above base 24, contacts and is sandwiched between and fills the space between post 22 and dielectric layer 34 and between post 22 and second conductive layer 36, contacts and is sandwiched between and fills the space between base 24 and dielectric layer 34 outside the periphery of second conductive layer 36 and between base 24 and second conductive layer 36, covers base 24 outside the periphery of post 22 in the upward direction, covers substrate 30 in the downward direction, covers and surrounds post 22 in the lateral directions, is contained in and fills most of the space between substrate 30 and heat spreader 74 and is solidified.

Substrate 30 is mounted on and contacts adhesive 26, extends above the underlying adhesive 26 and extends above base 24, first conductive layer 32 (as well as pad 62, routing lines 64 and 66 and terminal 68) contacts and extends above dielectric layer 34, dielectric layer 34 contacts and extends above second conductive layer 36 (including routing line 50) and is sandwiched between conductive layers 32 and 36, and second conductive layer 36 (including routing line 50) contacts and is embedded in adhesive 26.

Post 22, base 24 and cap 70 remain spaced from substrate 30. As a result, substrate 30 and heat spreader 74 are mechanically attached and electrically isolated from one another.

Base 24, adhesive 26, dielectric layer 34 and solder mask 76 extend to straight vertical peripheral edges of thermal board 80 after it is detached or singulated from a batch of identical simultaneously manufactured thermal boards.

Pad 62 is customized as an electrical interface for a semiconductor device such as an LED package or a semiconductor chip that is subsequently mounted on cap 70, terminal 68 is customized as an electrical interface for the next level assembly such as a solderable wire from a printed circuit board, cap 70 is customized as a thermal interface for the semiconductor device, and base 24 is customized as a thermal interface for the next level assembly such as a heat sink for an electronic device. Furthermore, cap 70 is thermally connected to base 24 by post 22.

Pad 62 and terminal 68 are laterally offset from one another and exposed at the top surface of thermal board 80, thereby providing horizontal fan-out routing between the semiconductor device and the next level assembly.

Pad 62, terminal 68 and cap 70 are coplanar with one another at their top surfaces above dielectric layer 34.

Conductive trace 72 is shown in cross-section as a continuous circuit trace for convenience of illustration. However, conductive trace 72 typically provides horizontal signal routing in both the X and Y directions. That is, pad 62 and terminal 68 are laterally offset from one another in the X and Y directions, and routing lines 50, 64 and 66 individually or in combination route in the X and Y directions.

Heat spreader 74 provides heat spreading and heat dissipation from a semiconductor device that is subsequently mounted on cap 70 to the next level assembly that thermal board 80 is subsequently mounted on. The semiconductor device generates heat that flows into cap 70, from cap 70 into post 22 and through post 22 into base 24 where it is spread out and dissipated in the downward direction, for instance to an underlying heat sink.

Thermal board 80 does not expose post 22, vias 42 and 44 or routing lines 50, 64 and 66. Post 22 is covered by cap 70, and vias 42 and 44 and routing lines 50, 64 and 66 are covered by solder mask 76, and adhesive 26 at its top surface is covered by cap 70 and solder mask 76. Post 22, adhesive 26, vias 42 and 44 and routing lines 50, 64 and 66 are shown in phantom in FIG. 4M for convenience of illustration.

Thermal board 80 includes other conductive traces 72 that typically include vias 42 and 44, routing lines 50, 64 and 66, pad 62 and terminal 68 and have a multi-level electrically conductive path between pad 62 and terminal 68. A single conductive trace 72 is described and labeled for convenience of illustration. In conductive traces 72, vias 42 and 44, pads 62 and terminals 68 generally have identical shapes and sizes whereas routing lines 50, 64 and 66 generally have different routing configurations. For instance, some conductive traces 72 may be spaced and separated and electrically isolated from one another whereas other conductive traces 72 can intersect or route to the same pad 62, routing line 50, 64, 66 or terminal 68 and be electrically connected to one another. Likewise, some pads 62 may receive independent signals whereas other pads 62 share a common signal, power or ground. In addition, some conductive traces 72 may include vias 42 and 44 and routing line 50 to provide multi-level routing whereas other conductive traces 72 may exclude vias 42 and 44 and routing line 50 and provide single-level routing at first conductive layer 32.

Thermal board 80 can be adapted for an LED package with blue, green and red LED chips, with each LED chip including an anode and a cathode and each LED package including a corresponding anode terminal and cathode terminal. In this instance, thermal board 80 can include six pads 62 and four terminals 68 so that each anode is routed from a separate pad 62 to a separate terminal 68 whereas each cathode is routed from a separate pad 62 to a common ground terminal 68.

A brief cleaning step can be applied to the structure at various manufacturing stages to remove oxides and debris that may be present on the exposed metal. For instance, a brief oxygen plasma cleaning step can be applied to the structure. Alternatively, a brief wet chemical cleaning step using a solution containing potassium permanganate can be applied to the structure. Likewise, the structure can be rinsed in distilled water to remove contaminants. The cleaning step cleans the desired surfaces without appreciably affecting or damaging the structure.

Advantageously, there is no plating bus or related circuitry that need be disconnected or severed from conductive traces 72 after they are formed. A plating bus can be disconnected during the wet chemical etch that forms pad 62, routing lines 64 and 66, terminal 68 and cap 70.

Thermal board 80 can include registration holes (not shown) that are drilled or sliced through base 24, adhesive 26, substrate 30 and solder mask 76 so that thermal board 80 can be positioned by inserting tooling pins through the registration holes when it is subsequently mounted on an underlying carrier.

Thermal board 80 can omit cap 70. This can be accomplished by adjusting etch mask 58 to expose third conductive layer 56 above all of aperture 52 to the wet chemical etch that forms pad 62, routing lines 64 and 66 and terminal 68.

Thermal board 80 can accommodate multiple semiconductor devices rather than one. This can be accomplished by adjusting etch mask 16 to define additional posts 22, adjusting adhesive 26 to include additional openings 28, adjusting substrate 30 to include additional apertures 52, adjusting etch mask 48 to define additional routing lines 50, adjusting etch mask 58 to define additional pads 62, routing lines 64 and 66, terminals 68 and caps 70 and adjusting solder mask 76 to contain additional openings. Likewise, substrate 30 can contain additional vias 42 and 44 and routing lines 50. The elements except for terminals 68 can be laterally repositioned to provide a 2×2 array for four semiconductor devices. In addition, the topography (lateral shape) can be adjusted for some but not all of the elements. For instance, pads 62, terminals 68 and caps 70 can retain the same topography whereas routing lines 50, 64 and 66 have different routing configurations.

Figure 5A:
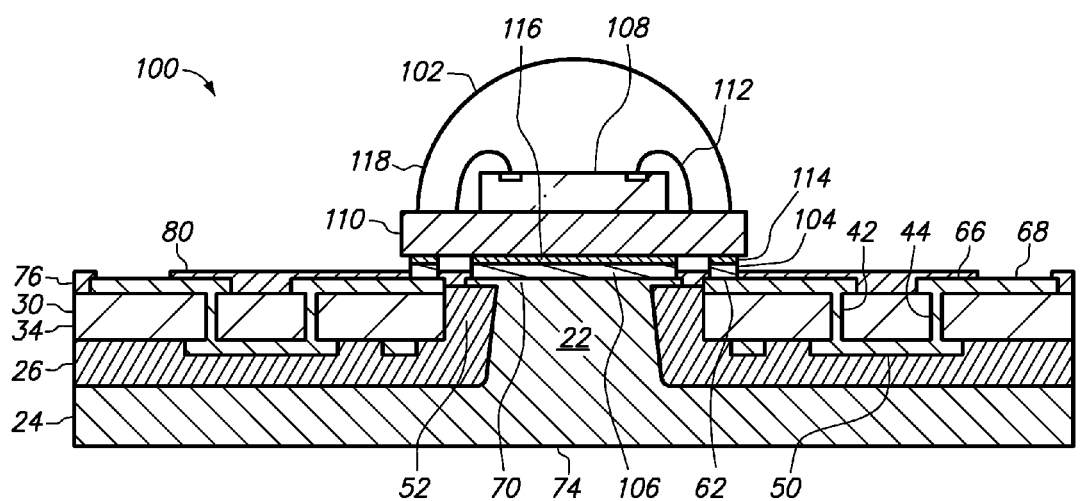
FIGS. 5A, 5B and 5C are cross-sectional, top and bottom views, respectively, of a semiconductor chip assembly that includes the thermal board and an LED package with backside contacts accordance with an embodiment of the present invention.
Figure 5B:
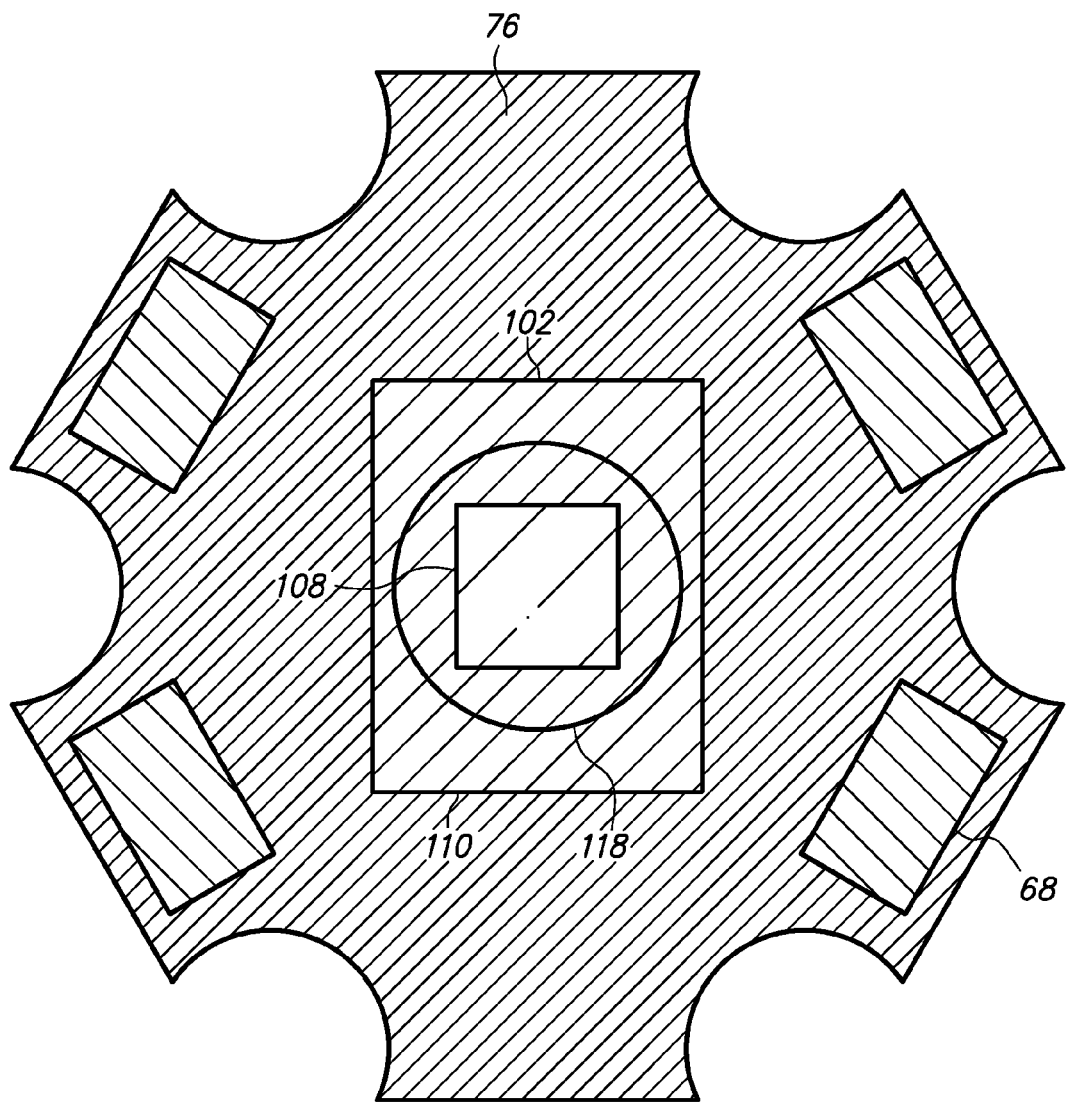
Figure 5C:
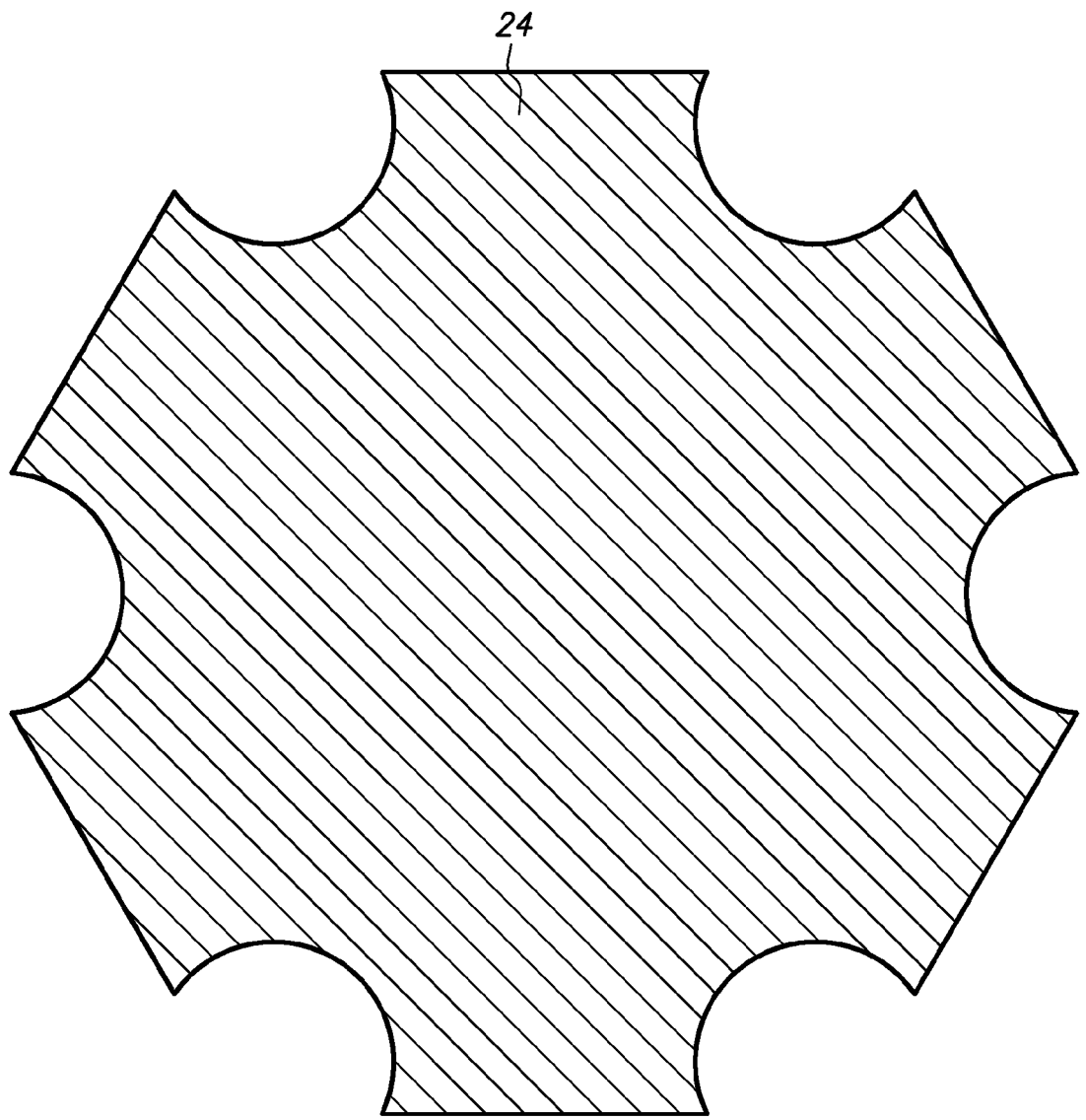

FIGS. 5A, 5B and 5C are cross-sectional, top and bottom views, respectively, of a semiconductor chip assembly that includes a thermal board and an LED package with backside contacts in accordance with an embodiment of the present invention.

Semiconductor chip assembly 100 includes thermal board 80, LED package 102 and solder joints 104 and 106. LED package 102 includes LED chip 108, submount 110, wire bond 112, electrical contact 114, thermal contact 116 and transparent encapsulant 118. LED chip 108 includes an electrode (not shown) electrically connected to a via (not shown) in submount 110 by wire bond 112, thereby electrically connecting LED chip 108 to electrical contact 114. LED chip 108 is mounted on and thermally connected to and mechanically attached to submount 110 by a die attach (not shown), thereby thermally connecting LED chip 108 to thermal contact 116. Submount 110 is a ceramic block with high thermal conductivity, and contacts 114 and 116 are plated on and protrude downwardly from the backside of submount 110.

LED package 102 is mounted on substrate 30 and heat spreader 74, electrically connected to substrate 30 and thermally connected to heat spreader 74. In particular, LED package 102 is mounted on pad 62 and cap 70, overlaps post 22, is electrically connected to substrate 30 by solder joint 104 and is thermally connected to heat spreader 74 by solder joint 106. For instance, solder joint 104 contacts and is sandwiched between and electrically connects and mechanically attaches pad 62 and electrical contact 114, thereby electrically connecting LED chip 108 to terminal 68. Likewise, solder joint 106 contacts and is sandwiched between and thermally connects and mechanically attaches cap 70 and thermal contact 116, thereby thermally connecting LED chip 108 to base 24. Pad 62 is spot plated with nickel/gold to bond well with solder joint 104 and is shaped and sized to match electrical contact 114, thereby improving signal transfer from substrate 30 to LED package 102. Likewise, cap 70 is spot plated with nickel/gold to bond well with solder joint 106 and is shaped and sized to match thermal contact 116, thereby improving heat transfer from LED package 102 to heat spreader 74.

Transparent encapsulant 118 is a solid adherent electrically insulative protective plastic enclosure that provides environmental protection such as moisture resistance and particle protection for chip 102 and wire bond 104. Chip 102 and wire bond 104 are embedded in transparent encapsulant 118.

Semiconductor chip assembly 100 can be manufactured by depositing a solder material on pad 62 and cap 70, then placing contacts 114 and 116 on the solder material over pad 62 and cap 70, respectively, and then reflowing the solder material to provide solder joints 104 and 106.

For instance, solder paste is selectively screen printed on pad 62 and cap 70, then LED package 102 is positioned over thermal board 80 using a pick-up head and an automated pattern recognition system in step-and-repeat fashion. The pick-up head places contacts 114 and 116 on the solder paste over pad 62 and cap 70, respectively. Next, the solder paste is heated and reflowed at a relatively low temperature such as 190° C. and then the heat is removed and the solder paste cools and solidifies to form hardened solder joints 104 and 106. Alternatively, solder balls are placed on pad 62 and cap 70, then contacts 114 and 116 are placed on the solder balls over pad 62 and cap 70, respectively, and then the solder balls are heated and reflowed to form solder joints 104 and 106.

The solder material can be initially deposited on thermal board 80 or LED package 102 by plating or printing or placement techniques, then sandwiched between thermal board 80 and LED package 102 and then reflowed. The solder material can also be deposited on terminal 68 if required for the next level assembly. Furthermore, a conductive adhesive such as silver-filled epoxy or other connection media can be used instead of solder, and the connection media on pad 62, terminal 68 and cap 70 need not be the same.

Semiconductor chip assembly 100 is a second-level single-chip module.

Figure 6A:
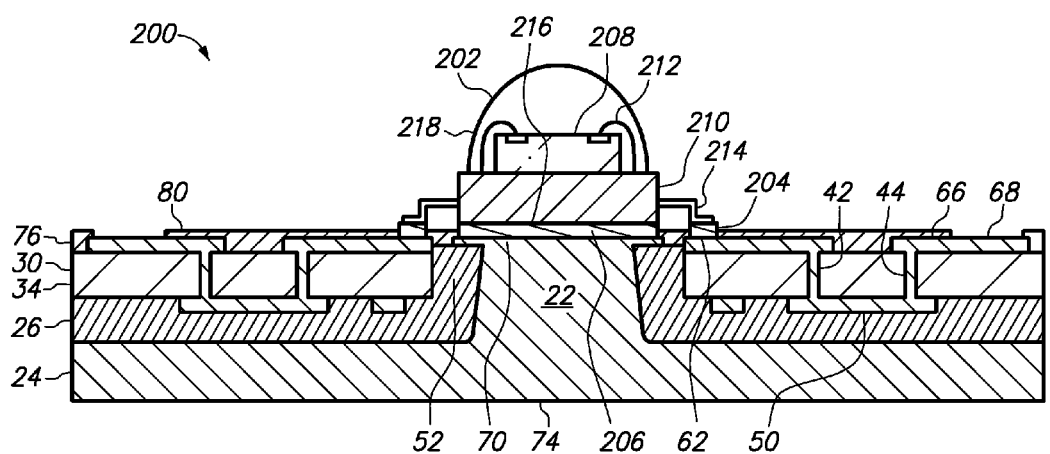
FIGS. 6A, 6B and 6C are cross-sectional, top and bottom views, respectively, of a semiconductor chip assembly that includes the thermal board and an LED package with lateral leads in accordance with an embodiment of the present invention.
Figure 6B:
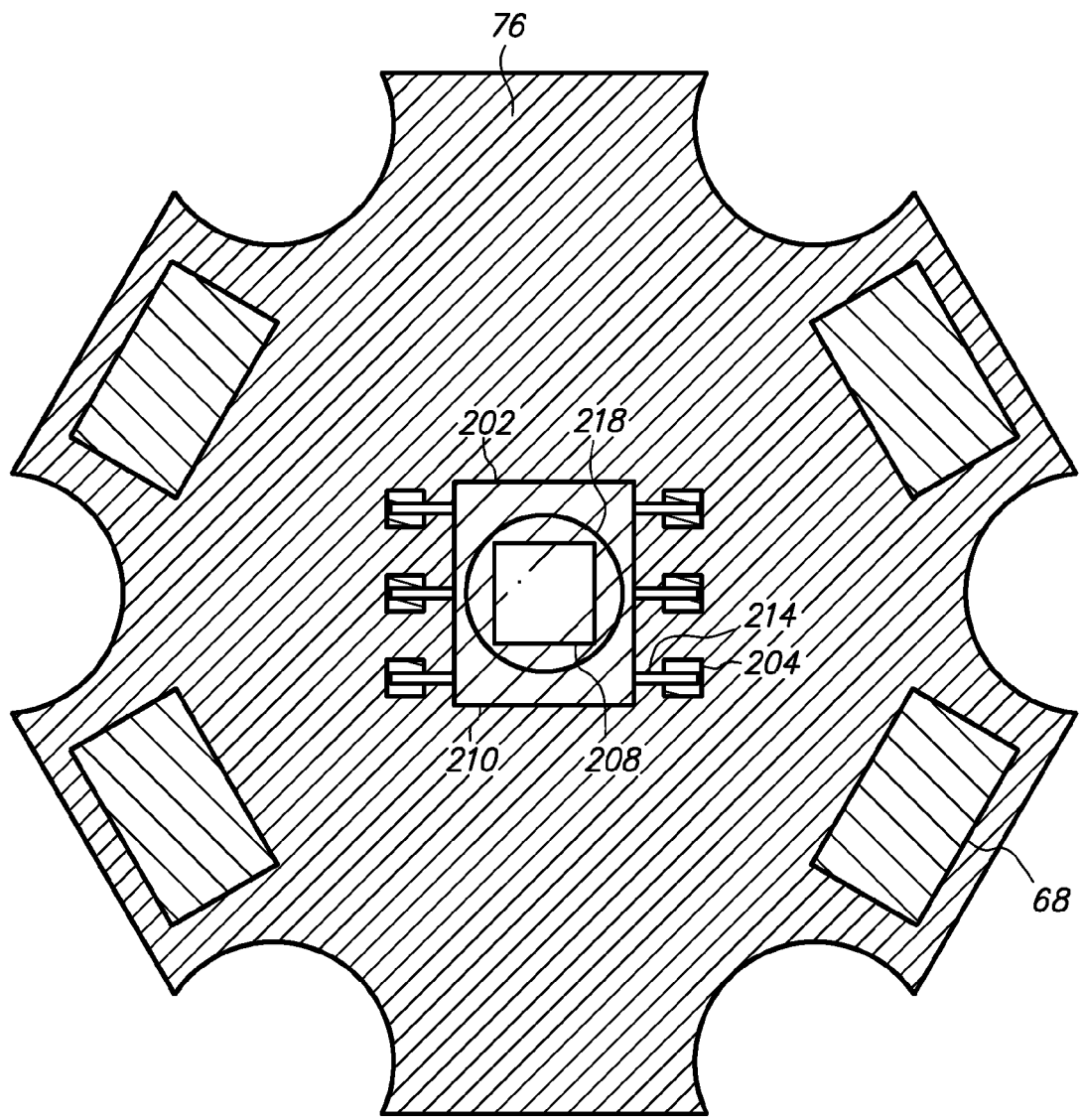
Figure 6C:
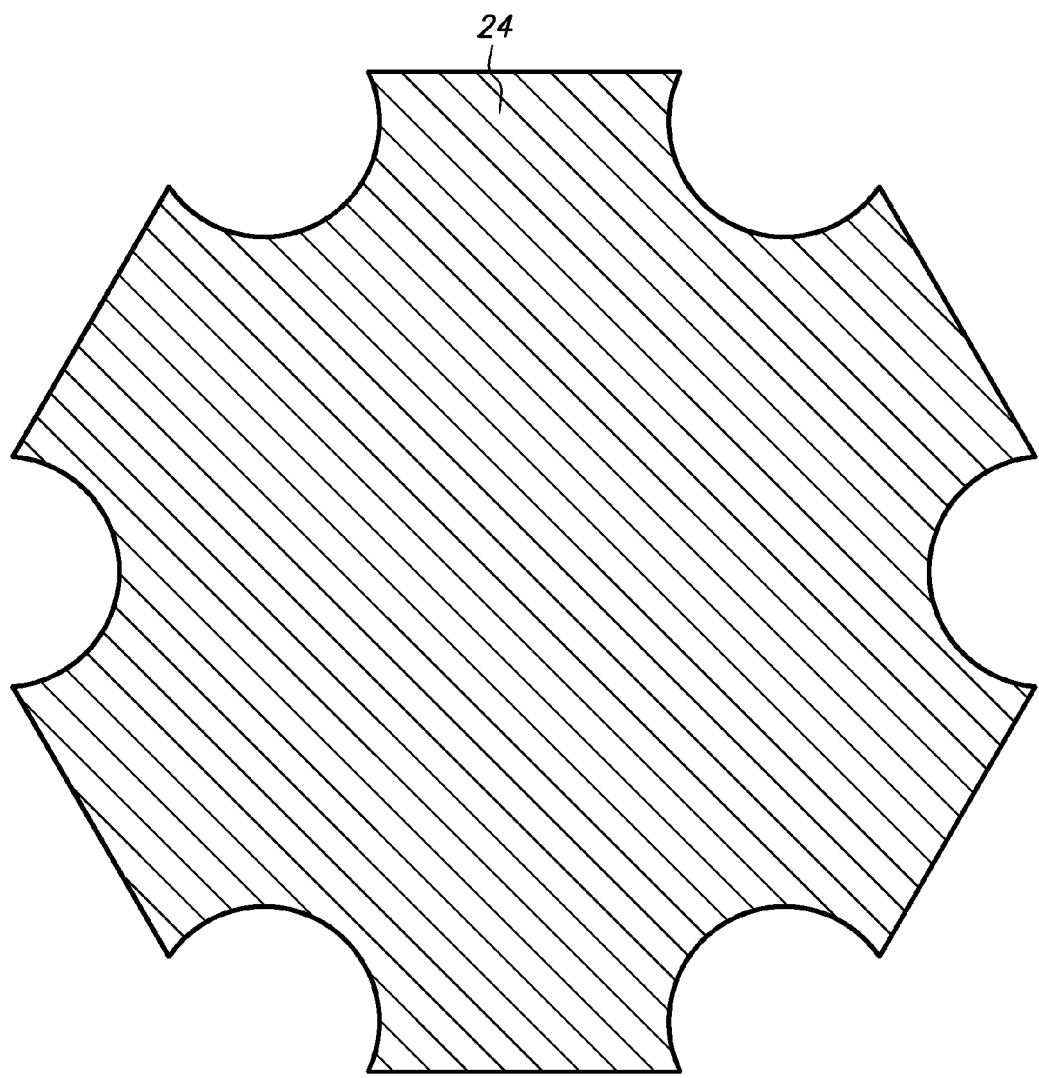

FIGS. 6A, 6B and 6C are cross-sectional, top and bottom views, respectively, of a semiconductor chip assembly that includes a thermal board and an LED package with lateral leads in accordance with an embodiment of the present invention.

In this embodiment, the LED package has lateral leads rather than backside contacts. For purposes of brevity, any description of assembly 100 is incorporated herein insofar as the same is applicable, and the same description need not be repeated. Likewise, elements of the assembly similar to those in assembly 100 have corresponding reference numerals indexed at two-hundred rather than one-hundred. For instance, LED chip 208 corresponds to LED chip 108, submount 210 corresponds to submount 110, etc.

Semiconductor chip assembly 200 includes thermal board 80, LED package 202 and solder joints 204 and 206. LED package 202 includes LED chip 208, submount 210, wire bond 212, lead 214 and transparent encapsulant 218. LED chip 208 is electrically connected to lead 214 by wire bond 212. Submount 210 includes thermal contact surface 216 at its backside, is narrower than submount 110 and has the same lateral size and shape as thermal contact 116. LED chip 208 is mounted on and thermally connected to and mechanically attached to submount 210 by a die attach (not shown), thereby thermally connecting LED chip 208 to thermal contact surface 216. Lead 214 extends laterally from submount 210 and thermal contact surface 216 faces downward.

LED package 202 is mounted on substrate 30 and heat spreader 74, electrically connected to substrate 30 and thermally connected to heat spreader 74. In particular, LED package 202 is mounted on pad 62 and cap 70, overlaps post 22, is electrically connected to substrate 30 by solder joint 204 and is thermally connected to heat spreader 74 by solder joint 206. For instance, solder joint 204 contacts and is sandwiched between and electrically connects and mechanically attaches pad 62 and lead 214, thereby electrically connecting LED chip 208 to terminal 68. Likewise, solder joint 206 contacts and is sandwiched between and thermally connects and mechanically attaches cap 70 and thermal contact surface 216, thereby thermally connecting LED chip 208 to base 24.

Semiconductor chip assembly 200 can be manufactured by depositing a solder material on pad 62 and cap 70, then placing lead 214 and thermal contact surface 216 on the solder material over pad 62 and cap 70, respectively, and then reflowing the solder material to provide solder joints 204 and 206.

Semiconductor chip assembly 200 is a second-level single-chip module.

Figure 7A:
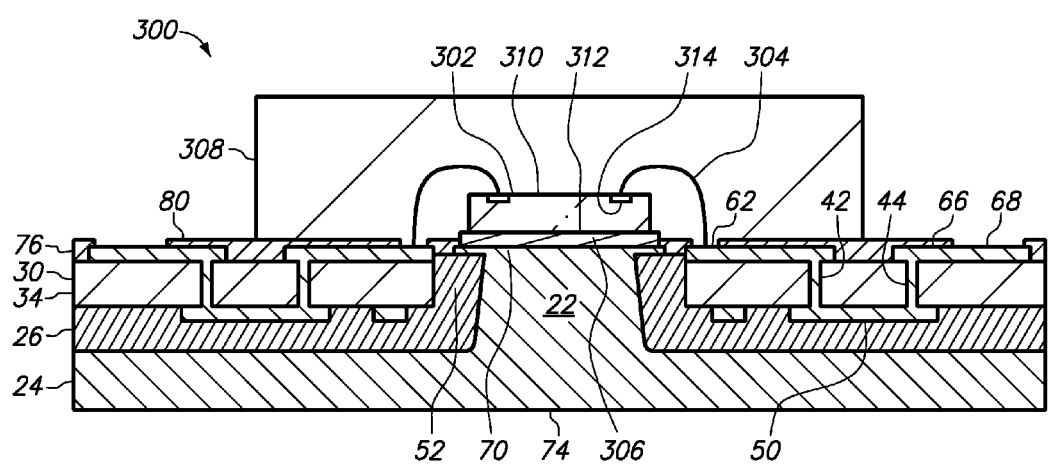
FIGS. 7A, 7B and 7C are cross-sectional, top and bottom views, respectively, of a semiconductor chip assembly that includes the thermal board and a semiconductor chip in accordance with an embodiment of the present invention.
Figure 7B:
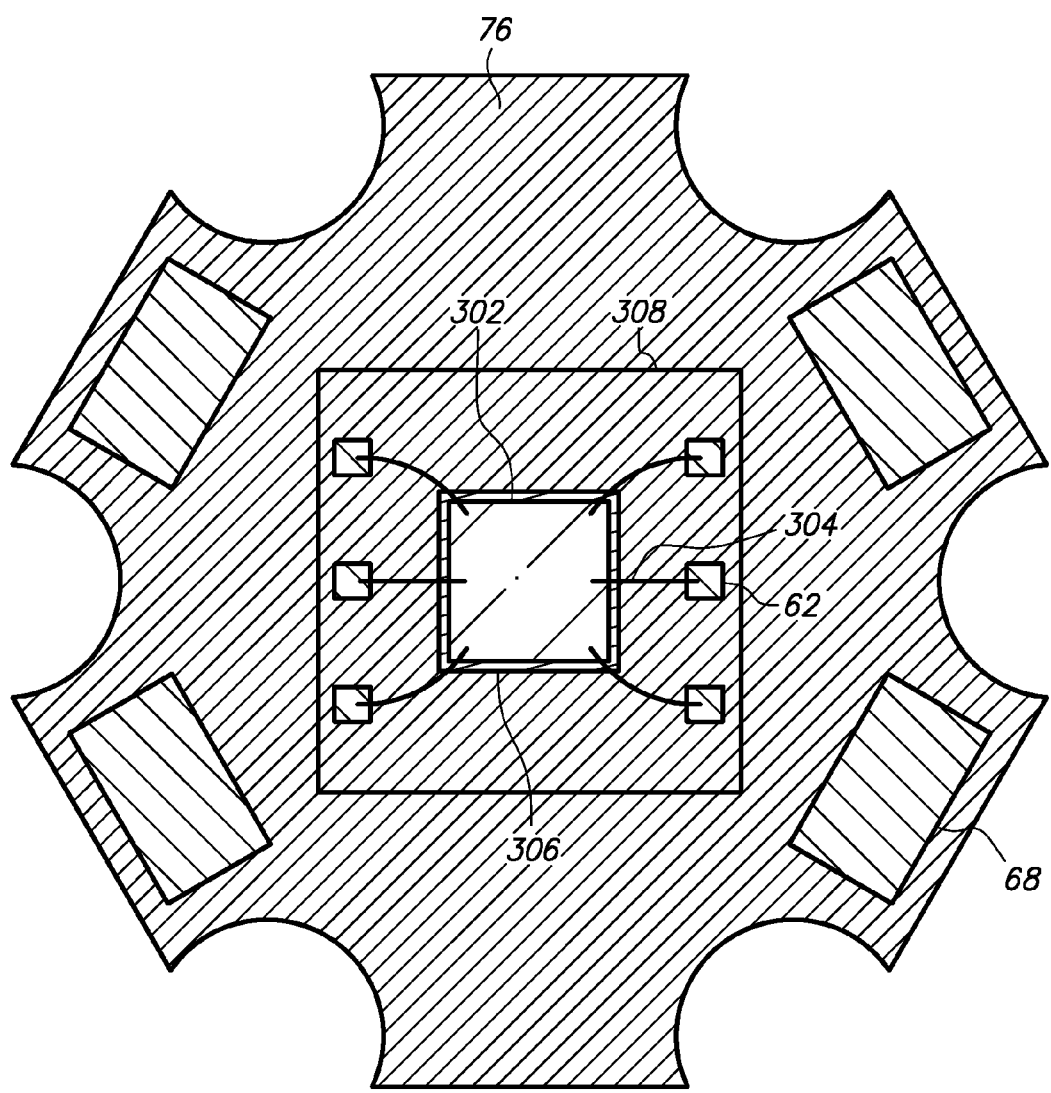
Figure 7C:
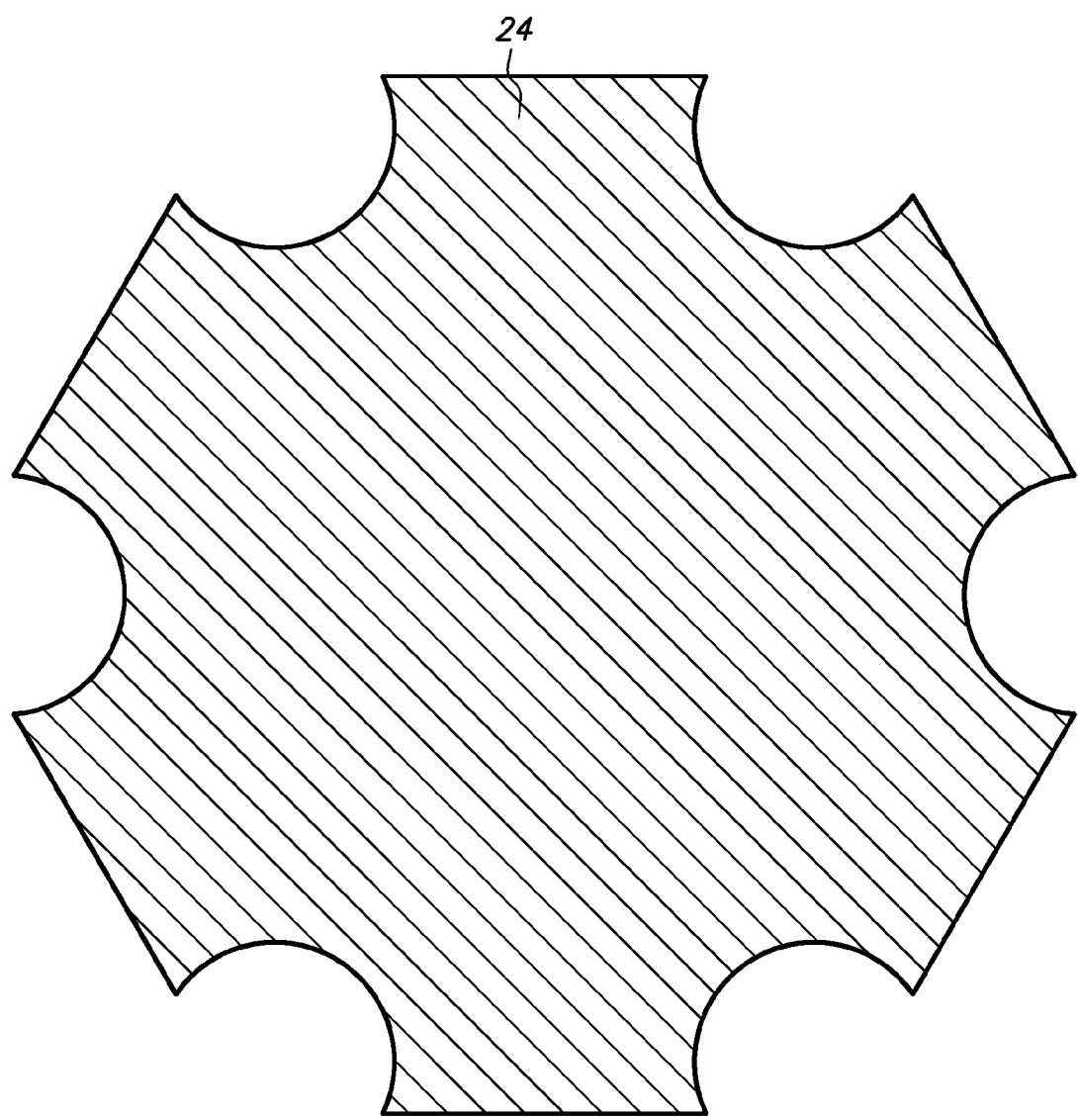

FIGS. 7A, 7B and 7C are cross-sectional, top and bottom views, respectively, of a semiconductor chip assembly that includes a thermal board and a semiconductor chip in accordance with an embodiment of the present invention.

In this embodiment, the semiconductor device is a chip rather than a package and the chip is mounted on the heat spreader but not the substrate. Furthermore, the chip overlaps the post but not the substrate, is electrically connected to the pad using a wire bond and is thermally connected to the cap using a die attach.

Semiconductor chip assembly 300 includes thermal board 80, LED chip 302, wire bond 304, die attach 306 and transparent encapsulant 308. LED chip 302 includes top surface 310, bottom surface 312 and bond pad 314. Top surface 310 is the active surface and includes bond pad 314 and bottom surface 312 is the thermal contact surface.

LED chip 302 is mounted on heat spreader 74, electrically connected to substrate 30 and thermally connected to heat spreader 74. In particular, LED chip 302 is mounted on cap 70, is within the periphery of cap 70, overlaps post 22 but does not overlap substrate 30, is electrically connected to substrate 30 by wire bond 304 and is thermally connected to and mechanically attached to heat spreader 74 by die attach 306. For instance, wire bond 304 is bonded to and electrically connects pads 62 and 314, thereby electrically connecting LED chip 302 to terminal 68. Likewise, die attach 306 contacts and is sandwiched between and thermally connects and mechanically attaches cap 70 and thermal contact surface 312, thereby thermally connecting LED chip 302 to base 24. Pad 62 is spot plated with nickel/silver to bond well with wire bond 304, thereby improving signal transfer from substrate 30 to LED chip 302, and cap 70 is shaped and sized to match thermal contact surface 312, thereby improving heat transfer from LED chip 302 to heat spreader 74. Transparent encapsulant 308 is similar to transparent encapsulant 118.

Semiconductor chip assembly 300 can be manufactured by mounting chip 302 on cap 70 using die attach 306, then wire bonding pads 62 and 314 and then forming transparent encapsulant 308.

For instance, die attach 306 is initially a silver-filled epoxy paste with high thermal conductivity that is selectively screen printed on cap 70 and then chip 302 placed on the epoxy paste using a pick-up head and an automated pattern recognition system in step-and-repeat fashion. Thereafter, the epoxy paste is heated and hardened at a relatively low temperature such as 190° C. to form die attach 306. Next, wire bond 304 is a gold wire that is thermosonically ball bonded to pads 62 and 314 and then transparent encapsulant 308 is transfer molded on the structure.

Chip 302 can be electrically connected to pad 62 by a wide variety of connection media, thermally connected to and mechanically attached to heat spreader 74 by a wide variety of thermal adhesives and encapsulated by a wide variety of encapsulants.

Semiconductor chip assembly 300 is a first-level single-chip package.

Figure 8A:
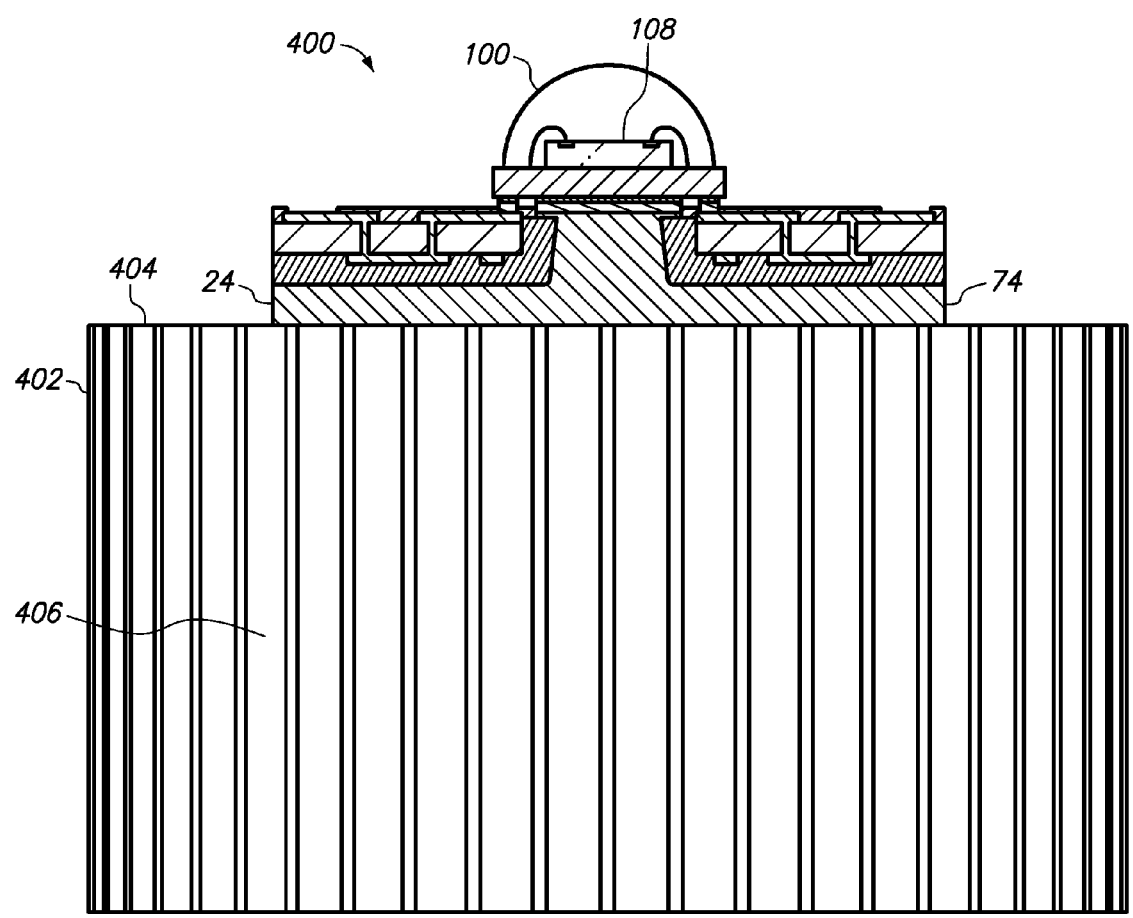
FIGS. 8A, 8B and 8C are cross-sectional, top and bottom views, respectively, of a light source subassembly that includes the semiconductor chip assembly and a heat sink in accordance with an embodiment of the present invention.
Figure 8B:
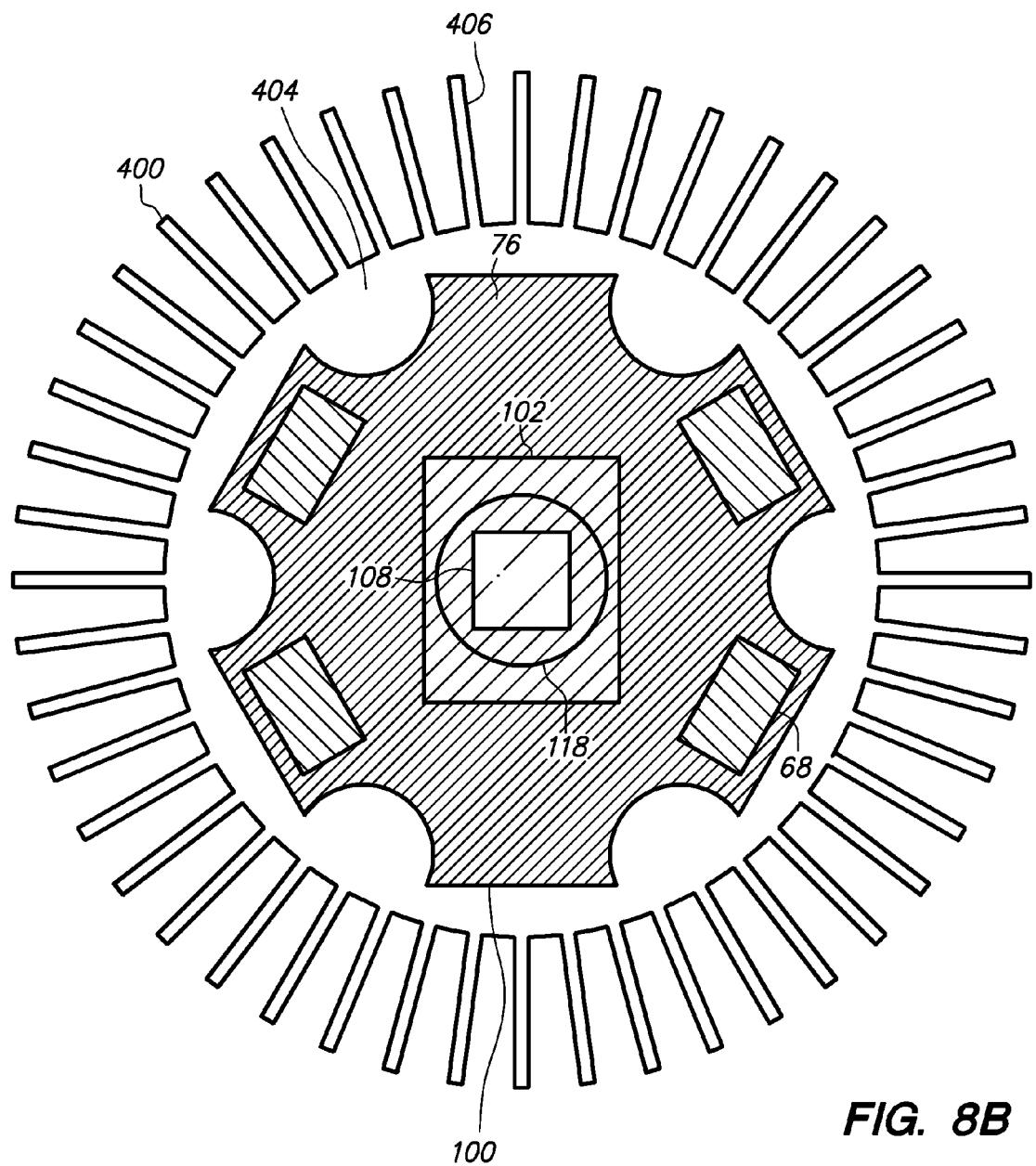
Figure 8C:
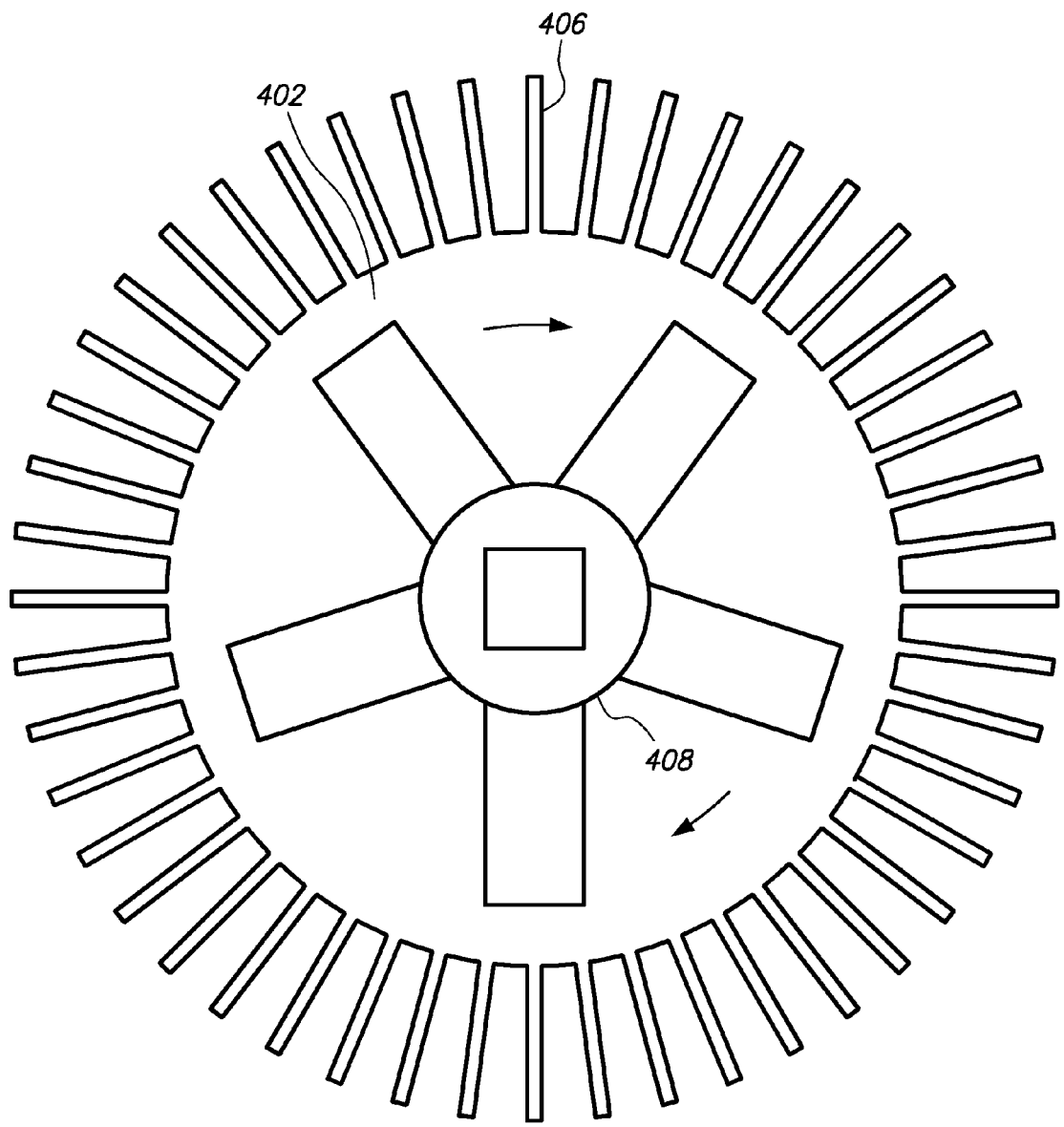

FIGS. 8A, 8B and 8C are cross-sectional, top and bottom views, respectively, of a light source subassembly that includes a semiconductor chip assembly and a heat sink in accordance with an embodiment of the present invention.

Light source subassembly 400 includes semiconductor chip assembly 100 and heat sink 402. Heat sink 402 includes thermal contact surface 404, fins 406 and fan 408. Assembly 100 is mounted on heat sink 402 and mechanically fastened to heat sink 402, for instance by screws (not shown). As a result, base 24 is clamped against and thermally connected to thermal contact surface 404, thereby thermally connecting heat spreader 74 to heat sink 402. Heat spreader 74 spreads the heat from LED chip 108 and transfers the spread heat to heat sink 402, which in turn dissipates the heat into the exterior environment using fins 406 and fan 408.

Light source subassembly 400 is designed for a light fixture (not shown) that is interchangeable with a standard incandescent light bulb. The light fixture includes subassembly 400, a glass cap, a threaded base, a control board, wiring and a housing. Subassembly 400, the control board and the wiring are enclosed within the housing. The wiring extends from the control board and is soldered to terminals 68. The glass cap and the threaded base protrude from opposite ends of the housing. The glass cap exposes LED chip 108, the threaded base is configured to screw into a light socket and the control board is electrically connected to terminals 68 by the wiring. The housing is a two-piece plastic shell with top and bottom pieces. The glass cap is attached to and protrudes above the top piece, the threaded base is attached to and protrudes below the bottom piece, and subassembly 400 and the control board are mounted on the bottom piece and extend into the top piece.

During operation, the threaded base transfers AC from a light socket to the control board, which converts the AC to modulated DC and the wiring transmits the modulated DC to terminal 68 and grounds another terminal 68. As a result, LED chip 108 illuminates bright light through the glass cap. LED chip 108 also generates intense localized heat that flows into and is spread by heat spreader 74 and flows from heat spreader 74 into heat sink 402 where fins 406 heat the air, and fan 408 blows the hot air radially outward through slots in the housing into the external environment.

The semiconductor chip assemblies and thermal boards described above are merely exemplary. Numerous other embodiments are contemplated. In addition, the embodiments described above can be mixed-and-matched with one another and with other embodiments depending on design and reliability considerations. For instance, a thermal board with multiple posts for multiple LED packages can include some conductive traces 72 that include vias 42 and 44 and routing line 50 and other conductive traces 72 that exclude vias 42 and 44 and routing line 50 and do not extend through dielectric layer 34. Likewise, the semiconductor device can be an LED package with multiple LED chips and the substrate can include additional conductive traces to receive and route additional electrical contacts on the package. Likewise, the semiconductor device and the cap can overlap the substrate as well as the underlying adhesive.

The semiconductor device can share or not share the heat spreader with other semiconductor devices. For instance, a single semiconductor device can be mounted on the heat spreader. Alternatively, numerous semiconductor devices can mounted on the heat spreader. For instance, four small chips in a 2×2 array can be attached to the post and the substrate can include additional conductive traces to receive and route additional wire bonds to accommodate the chips. This may be more cost effective than providing a miniature post for each chip.

The semiconductor chip can be optical or non-optical. For instance, the chip can be an LED, a solar cell, a power chip or a controller chip. Likewise, the semiconductor package can be an LED package or an RF module. Thus, the semiconductor device can be a packaged or unpackaged optical or non-optical chip. Furthermore, the semiconductor device can be mechanically, electrically and thermally connected to the thermal board using a wide variety of connection media including solder and electrically and/or thermally conductive adhesive.

The heat spreader can provide rapid, efficient and essentially uniform heat spreading and dissipation for the semiconductor device to the next level assembly without heat flow through the adhesive, the substrate or elsewhere in the thermal board. As a result, the adhesive can have low thermal conductivity which drastically reduces cost. The heat spreader can be copper and include a post and base that are integral with one another and a cap that is metallurgically bonded and thermally connected to the post, thereby enhancing reliability and reducing cost. The cap can be coplanar with the pad, thereby facilitating the electrical, thermal and mechanical connections with the semiconductor device. Furthermore, the cap can be customized for the semiconductor device and the base can be customized for the next level assembly, thereby enhancing the thermal connection from the semiconductor device to the next level assembly. For instance, the post can have a circular shape in a lateral plane and the cap can have a square or rectangular shape in a lateral plane with the same or similar topography as the thermal contact of the semiconductor device.

The heat spreader can be electrically connected to or isolated from the semiconductor device and the substrate. For instance, the third conductive layer can include a routing line that extends across the adhesive between the substrate and the cap and electrically connects the semiconductor device to the heat spreader. Thereafter, the heat spreader can be electrically connected to ground, thereby electrically connecting the semiconductor device to ground.

The post can be deposited on or integral with the base. For instance, the post can be integral with the base when the post and the base are a single-piece metal or include a single-piece metal at their interface as well as additional metal elsewhere. The post can include a flat top surface or portion. For instance, the post can be coplanar with the adhesive or the post can be etched after the adhesive is solidified to provide a cavity in the adhesive over the post. The post can also be selectively etched to provide a cavity in the post that extends below its top surface. In either case, the semiconductor device can be mounted on the post and located in the cavity, and the wire bond can extend into the cavity to the semiconductor device and out of the cavity to the pad. In this instance, the semiconductor device can be an LED chip and the cavity can focus the LED light in the upward direction.

The base can provide mechanical support for the substrate. For instance, the base can prevent the substrate from warping during metal grinding, chip mounting, wire bonding and encapsulant molding. Furthermore, the base can include fins at its backside that protrude in the downward direction. For instance, the base can be cut at its bottom surface by a routing machine to form lateral grooves that define the fins. In this instance, the base can have a thickness of 700 microns, the grooves can have a depth of 500 microns and the fins can have a height of 500 microns. The fins can increase the surface area of the base, thereby increasing the thermal conductivity of the base by thermal convection when it remains exposed to the air rather than mounted on a heat sink.

The cap can be formed by numerous deposition techniques including electroplating, electroless plating, evaporating and sputtering as a single layer or multiple layers after the adhesive is solidified, either before, during or after the pad and/or terminal is formed. The cap can be the same metal as the post. Furthermore, the cap can extend across the aperture to the substrate or remain within the periphery of the aperture. Thus, the cap may contact or be spaced from the substrate. In either case, the cap extends laterally from the top of the post in the lateral directions.

The adhesive can provide a robust mechanical bond between the heat spreader and the substrate. For instance, the adhesive can fill the space between the heat spreader and the substrate, the adhesive can be located in this space and the adhesive can be void-free with consistent bond lines. The adhesive can also absorb thermal expansion mismatch between the heat spreader and the substrate. Furthermore, the adhesive can be a low cost dielectric that need not have high thermal conductivity. Moreover, the adhesive is not prone to delamination.

The adhesive thickness can be adjusted so that the adhesive essentially fills the gap and essentially all the adhesive is within structure once it is solidified and/or grinded. For instance, the optimal prepreg thickness can be established through trial and error.

The substrate can provide flexible multi-layer signal routing in the X and Y directions to provide complex routing patterns. The pad and the terminal can have a wide variety of packaging formats as required by the semiconductor device and the next level assembly. Furthermore, the substrate can be a low cost laminated structure that need not have high thermal conductivity.

The pad and the cap can be coplanar at their top surfaces, thereby enhancing solder joints between the semiconductor device and the thermal board by controlling solder ball collapse.

The pad, the terminal and the routing lines over the dielectric layer can be formed by numerous deposition techniques including electroplating, electroless plating, evaporating and sputtering as a single layer or multiple layers, either before or after the substrate is mounted on the adhesive. For instance, the first and second conductive layers can be patterned on the substrate before it is mounted on the adhesive.

The plated contact surface finish can be formed before or after the pad and the terminal are formed. For instance, the plated layer can be deposited on the third conductive layer and then patterned using the etch mask that defines the pad and the terminal.

The conductive trace can include additional pads, terminals, vias and routing lines as well as passive components and have different configurations. The conductive trace can function as a signal, power or ground layer depending on the purpose of the corresponding semiconductor device pad. The conductive trace can also include various conductive metals such as copper, gold, nickel, silver, palladium, tin, combinations thereof, and alloys thereof. The preferred composition will depend on the nature of the external connection media as well as design and reliability considerations. Furthermore, those skilled in the art will understand that in the context of a semiconductor chip assembly, the copper material can be pure elemental copper but is typically a copper alloy that is mostly copper such copper-zirconium (99.9% copper), copper-silver-phosphorus-magnesium (99.7% copper) and copper-tin-iron-phosphorus (99.7% copper) to improve mechanical properties such as tensile strength and elongation.

The cap, solder mask, plated contacts and third conductive layer are generally desirable but may be omitted in some embodiments.

The working format for the thermal board can be a single board or multiple thermal boards based on the manufacturing design. For instance, a single thermal board can be manufactured individually. Alternatively, numerous thermal boards can be simultaneously batch manufactured using a single metal plate, a single adhesive, a single substrate and a single solder mask and then separated from one another. Likewise, numerous sets of heat spreaders and conductive traces that are each dedicated to a single semiconductor device can be simultaneously batch manufactured for each thermal board in the batch using a single metal plate, a single adhesive, a single substrate and a single solder mask.

For example, multiple recesses can be etched in the metal plate to form multiple posts and the base, then the non-solidified adhesive with openings corresponding to the posts can be mounted on the base such that each post extends through an opening, then the substrate (with a single first conductive layer, a single dielectric layer, apertures corresponding to the posts, underlying routing lines corresponding to the apertures and vias corresponding to the routing lines) can be mounted on the adhesive such that each post extends through an opening into an aperture, then the base and the substrate can be moved towards one another by platens to force the adhesive into the gaps in the apertures between the posts and the substrates, then the adhesive can be cured and solidified, then the posts, the adhesive and the first conductive layer can be grinded to form a lateral top surface, then the third conductive layer can be plated on the posts, the adhesive and the first conductive layer, then the first and third conductive layers can be etched to form the pads and the terminals corresponding to the posts and the third conductive layer can be etched to form the caps corresponding to the posts, then the solder mask can be deposited on the structure and patterned to expose the pads, the terminals and the caps, then the plated contact surface finish can be formed on the base, the pads, the terminals and the caps and then the base, the substrate, the adhesive and the solder mask can be cut or cracked at the desired locations of the peripheral edges of the thermal boards, thereby separating the individual thermal boards from one another.

The working format for the semiconductor chip assembly can be a single assembly or multiple assemblies based on the manufacturing design. For instance, a single assembly can be manufactured individually. Alternatively, numerous assemblies can be simultaneously batch manufactured before the thermal boards are separated from one another. Likewise, multiple semiconductor devices can be electrically, thermally and mechanically connected to each thermal board in the batch.

For example, solder paste portions can be deposited on the pads and the caps, then the LED packages can be placed on the solder paste portions, then the solder paste portions can be simultaneously heated, reflowed and hardened to provide the solder joints, and then the thermal boards can be separated from one another.

As another example, die attach paste portions can be deposited on the caps, then the chips can be placed on the die attach paste portions, then the die attach paste portions can be simultaneously heated and hardened to provide the die attaches, then the chips can be wired bonded to the corresponding pads, then encapsulants can be formed over the corresponding chips and the wire bonds, and then the thermal boards can be separated from one another.

The thermal boards can be detached from one another in a single step or multiple steps. For instance, the thermal boards can be batch manufactured as a panel, then the semiconductor devices can be mounted on the panel and then the semiconductor chip assemblies of the panel can be detached from one another. Alternatively, the thermal boards can be batch manufactured as a panel, then the thermal boards of the panel can be singulated into strips of multiple thermal boards, then the semiconductor devices can be mounted on the thermal boards of a strip and then the semiconductor chip assemblies of the strip can be detached from one another. Furthermore, the thermal boards can be detached by mechanical sawing, laser sawing, cleaving or other suitable techniques.

The manufacturing process is highly versatile and permits a wide variety of mature electrical, thermal and mechanical connection technologies to be used in a unique and improved manner. The manufacturing process can also be performed without expensive tooling. As a result, the manufacturing process significantly enhances throughput, yield, performance and cost effectiveness compared to conventional packaging techniques. Moreover, the assembly is well-suited for copper chip and lead-free environmental requirements.

The term "adjacent" refers to elements that are integral (single-piece) or in contact (not spaced or separated from) with one another. For instance, the post is adjacent to the base regardless of whether the post is formed additively or subtractively.

The term "overlap" refers to above and extending within a periphery of an underlying element. Overlap includes extending inside and outside the periphery or residing within the periphery. For instance, the semiconductor device overlaps the post since an imaginary vertical line intersects the semiconductor device and the post, regardless of whether another element such as the cap is between the semiconductor device and the post and is intersected by the line, and regardless of whether another imaginary vertical line intersects the semiconductor device but not the post (outside the periphery of the post). Likewise, the adhesive overlaps the base and is overlapped by the pad and the terminal, and the base is overlapped by the post. Likewise, the post overlaps and is within a periphery of the base. Moreover, overlap is synonymous with over and overlapped by is synonymous with under or beneath.

The term "contact" refers to direct contact. For instance, the dielectric layer contacts the first and second conductive layers but does not contact the post or the base.

The term "cover" refers to complete coverage in the upward, downward and/or lateral directions. For instance, the base covers the post in the downward direction but the post does not cover the base in the upward direction.

The term "layer" refers to patterned and unpatterned layers. For instance, the first conductive layer can be an unpatterned blanket sheet and the second conductive layer can be a patterned circuit with spaced traces when the substrate is mounted on the adhesive, and the first conductive layer can be a patterned circuit when the semiconductor device is mounted on the heat spreader. Furthermore, a layer can include stacked layers.

The term "pad" in conjunction with the substrate refers to a connection region that is adapted to contact and/or bond to external connection media (such as solder or a wire bond) that electrically connects the pad to the semiconductor device.

The term "terminal" in conjunction with the substrate refers to a connection region that is adapted to contact and/or bond to external connection media (such as solder or a wire bond) that electrically connects the terminal to an external device (such as a PCB or a wire thereto).

The term "cap" in conjunction with the heat spreader refers to a contact region that is adapted to contact and/or bond to external connection media (such as solder or thermally conductive adhesive) that thermally connects the cap to the semiconductor device.

The terms "opening" and "aperture" refer to a through-hole and are synonymous. For instance, the post is exposed by the adhesive in the upward direction when it is inserted into the opening in the adhesive. Likewise, the post is exposed by the substrate in the upward direction when it is inserted into the aperture in the substrate.

The term "inserted" refers to relative motion between elements. For instance, the post is inserted into the aperture regardless of whether the post is stationary and the substrate moves towards the base, the substrate is stationary and the post moves towards the substrate or the post and the substrate both approach the other. Furthermore, the post is inserted (or extends) into the aperture regardless of whether it is goes through (enters and exits) or does not go through (enters without exiting) the aperture.

The phrase "move towards one another" also refers to relative motion between elements. For instance, the base and the substrate move towards one another regardless of whether the base is stationary and the substrate moves towards the base, the substrate is stationary and the base moves towards the substrate or the base and the substrate both approach the other.

The phrase "mounted on" includes contact and non-contact with a single or multiple support element(s). For instance, the semiconductor device is mounted on the heat spreader regardless of whether it contacts the heat spreader or is separated from the heat spreader by a die attach. Likewise, the semiconductor device is mounted on the heat spreader regardless of whether it is mounted on the heat spreader alone or the heat spreader and the substrate.

The phrase "adhesive . . . in the gap" refers to the adhesive in the gap. For instance, adhesive that extends across the dielectric layer in the gap refers to the adhesive in the gap that extends across the dielectric layer. Likewise, adhesive that contacts and is sandwiched between the post and the dielectric layer in the gap refers to the adhesive in the gap that contacts and is sandwiched between the post at the inner sidewall of the gap and the dielectric layer at the outer sidewall of the gap.

The term "above" refers to upward extension and includes adjacent and non-adjacent elements as well as overlapping and non-overlapping elements. For instance, the post extends above, is adjacent to, overlaps and protrudes from the base. Likewise, the post extends above the dielectric layer even though it is not adjacent to or overlap the dielectric layer.

The term "below" refers to downward extension and includes adjacent and non-adjacent elements as well as overlapping and non-overlapping elements. For instance, the base extends below, is adjacent to, is overlapped by and protrudes from the post. Likewise, the post extends below the dielectric layer even though it is not adjacent to or overlapped by the dielectric layer.

The "upward" and "downward" vertical directions do not depend on the orientation of the semiconductor chip assembly (or the thermal board), as will be readily apparent to those skilled in the art. For instance, the post extends vertically above the base in the upward direction and the adhesive extends vertically below the pad in the downward direction regardless of whether the assembly is inverted and/or mounted on a heat sink. Likewise, the base extends "laterally"

from the post in a lateral plane regardless of whether the assembly is inverted, rotated or slanted. Thus, the upward and downward directions are opposite one another and orthogonal to the lateral directions, and laterally aligned elements are coplanar with one another at a lateral plane orthogonal to the upward and downward directions.

The semiconductor chip assembly of the present invention has numerous advantages. The assembly is reliable, inexpensive and well-suited for high volume manufacture. The assembly is especially well-suited for high power semiconductor devices such as LED packages and large semiconductor chips which generate considerable heat and require excellent heat dissipation in order to operate effectively and reliably.

The embodiments described herein are exemplary and may simplify or omit elements or steps well-known to those skilled in the art to prevent obscuring the present invention. Likewise, the drawings may omit duplicative or unnecessary elements and reference labels to improve clarity.

Various changes and modifications to the embodiments described herein will be apparent to those skilled in the art. For instance, the materials, dimensions, shapes, sizes, steps and arrangement of steps described above are merely exemplary. Such changes, modifications and equivalents may be made without departing from the spirit and scope of the present invention as defined in the appended claims.

We claim:

1. A semiconductor chip assembly, comprising:
   a semiconductor device;
   an adhesive that includes an opening;
   a heat spreader that includes a post and a base, wherein the post is adjacent to the base and extends above the base in an upward direction, and the base extends below the post in a downward direction opposite the upward direction and extends laterally from the post in lateral directions orthogonal to the upward and downward directions; and
   a substrate that includes a pad, a terminal, a routing line, first and second vias and a dielectric layer, wherein the pad and the terminal extend above the dielectric layer, the routing line extends below the dielectric layer, the vias each extend through the dielectric layer to the routing line, an electrically conductive path between the pad and the terminal includes the first via, the routing line and the second via, and an aperture extends through the substrate;
   wherein the semiconductor device is mounted on the heat spreader, overlaps the post, is electrically connected to the pad and thereby electrically connected to the terminal, and is thermally connected to the post and thereby thermally connected to the base;
   wherein the adhesive is mounted on and extends above the base, extends into a gap in the aperture between the post and the substrate, extends across the dielectric layer in the gap and is sandwiched between the post and the dielectric layer, between the base and the dielectric layer and between the base and the routing line;
   wherein the substrate is mounted on the adhesive and extends above the base, and the routing line is embedded in the adhesive; and
   wherein the post extends into the opening and the aperture and above the dielectric layer, and the base extends below the semiconductor device, the adhesive and the substrate.

2. The assembly of claim 1, wherein the semiconductor device is an LED package that includes an LED chip.

3. The assembly of claim 1, wherein the semiconductor device is an LED package that includes an LED chip, is electrically connected to the pad using a first solder joint and is thermally connected to the post using a second solder joint.

4. The assembly of claim 1, wherein the adhesive contacts the post and the dielectric layer in the gap and contacts the base, the dielectric layer and the routing line outside the gap.

5. The assembly of claim 1, wherein the adhesive covers the substrate in the downward direction and covers and surrounds the post in the lateral directions.

6. The assembly of claim 1, wherein the adhesive fills the gap and the space between the base and the substrate where the substrate overlaps the base.

7. The assembly of claim 1, wherein the adhesive is contained in the space between the heat spreader and the substrate.

8. The assembly of claim 1, wherein the adhesive extends to peripheral edges of the assembly.

9. The assembly of claim 1, wherein the post is integral with the base.

10. The assembly of claim 1, wherein the post is coplanar with the adhesive above the dielectric layer.

11. The assembly of claim 1, wherein the post has a diameter that decreases as it extends upwardly from the base to its flat top.

12. The assembly of claim 1, wherein the base covers the semiconductor device, the post, the substrate and the adhesive in the downward direction and extends to peripheral edges of the assembly.

13. The assembly of claim 1, wherein the substrate is spaced from the post and the base.

14. The assembly of claim 1, wherein the heat spreader includes a cap that extends above and is adjacent to and covers in the upward direction and extends laterally in the lateral directions from a top of the post and that contacts and overlaps the adhesive.

15. The assembly of claim 14, wherein the cap has a rectangular or square shape and the top of the post has a circular shape.

16. A semiconductor chip assembly, comprising:
    a semiconductor device;
    an adhesive that includes an opening;
    a heat spreader that includes a post, a base and a cap, wherein the post is adjacent to and integral with the base, extends above the base in an upward direction and thermally connects the base and the cap, the base extends below the post in a downward direction opposite the upward direction and extends laterally from the post in lateral directions orthogonal to the upward and downward directions, and the cap extends above and is adjacent to and covers in the upward direction and extends laterally in the lateral directions from a top of the post; and
    a substrate that includes first and second conductive layers, first and second vias and a dielectric layer, wherein the first conductive layer contacts and extends above the dielectric layer, the second conductive layer contacts and extends below the dielectric layer, a pad and a terminal include selected portions of the first conductive layer and contact and extend above the dielectric layer, a routing line includes a selected portion of the second conductive layer and contacts and extends below the dielectric layer, the vias each contact and extend through the dielectric layer between the conductive layers, an electrically conductive path between the pad and the terminal includes in sequence the first via, the routing line and the second via, and an aperture extends through the substrate;

wherein the semiconductor device is mounted on the cap, overlaps the post, is electrically connected to the pad and thereby electrically connected to the terminal, and is thermally connected to the cap and thereby thermally connected to the base;

wherein the adhesive is mounted on and extends above the base, extends into a gap in the aperture between the post and the substrate, extends across the dielectric layer in the gap, is sandwiched between the post and the dielectric layer in the gap, is sandwiched between the base and the dielectric layer and between the base and the second conductive layer outside the gap, covers the substrate in the downward direction and surrounds the post in the lateral directions;

wherein the substrate is mounted on the adhesive and extends above the base, and the second conductive layer is embedded in the adhesive; and wherein the post extends into the opening and the aperture and above and below the dielectric layer, the cap contacts and overlaps the adhesive and the base extends below the semiconductor device, the adhesive and the substrate and covers the semiconductor device, the post, the cap, the substrate and the adhesive in the downward direction.

17. The assembly of claim 16, wherein the semiconductor device is an LED package that includes an LED chip, is electrically connected to the pad using a first solder joint and is thermally connected to the cap using a second solder joint.

18. The assembly of claim 16, wherein the semiconductor device is a semiconductor chip that is electrically connected to the pad using a wire bond and is thermally connected to the cap using a die attach.

19. The assembly of claim 16, wherein the substrate is spaced from the post and the base, and the adhesive fills the gap and the space between the base and the substrate where the substrate overlaps the base.

20. The assembly of claim 16, wherein the post has a diameter that decreases as it extends upwardly from the base to the cap.

21. A semiconductor chip assembly, comprising:
a semiconductor device;
an adhesive that includes an opening;
a heat spreader that includes a post, a base and a cap, wherein the post is adjacent to and integral with the base, extends above the base in an upward direction and thermally connects the base and the cap, the base extends below the post in a downward direction opposite the upward direction and extends laterally from the post in lateral directions orthogonal to the upward and downward directions, and the cap extends above and is adjacent to and covers in the upward direction and extends laterally in the lateral directions from a top of the post;
a substrate that includes first and second conductive layers, first and second vias and a dielectric layer, wherein the first conductive layer contacts and extends above the dielectric layer, the second conductive layer contacts and extends below the dielectric layer, a pad and a terminal include selected portions of the first conductive layer and contact and extend above the dielectric layer, a routing line includes a selected portion of the second conductive layer and contacts and extends below the dielectric layer, the vias each contact and extend through the dielectric layer between the conductive layers, an electrically conductive path between the pad and the terminal includes in sequence the first via, the routing line and the second via, and an aperture extends through the substrate;

wherein the semiconductor device is mounted on the cap, overlaps the post, is electrically connected to the pad and thereby electrically connected to the terminal, and is thermally connected to the cap and thereby thermally connected to the base;

wherein the adhesive is mounted on and extends above the base, extends into a gap in the aperture between the post and the substrate, extends across the dielectric layer in the gap, contacts and is sandwiched between the post and the dielectric layer in the gap, contacts and is sandwiched between the base and the dielectric layer and between the base and the second conductive layer outside the gap, covers the substrate in the downward direction, covers and surrounds the post in the lateral directions, extends laterally from the post to or beyond the terminal and extends to peripheral edges of the assembly;

wherein the substrate is mounted on the adhesive, extends above the base and is spaced from the post and the base, and the second conductive layer is embedded in the adhesive; and wherein the post extends into the opening and the aperture and above the dielectric layer and is coplanar with the adhesive above the dielectric layer and above bottom surfaces of the pad and the terminal and below top surfaces of the pad and the terminal, the cap contacts and overlaps the adhesive and is coplanar with the pad and the terminal above the adhesive and the dielectric layer at a surface that faces in the upward direction, and the base extends below the semiconductor device, the adhesive and the substrate, covers the semiconductor device, the post, the cap, the substrate and the adhesive in the downward direction, supports the substrate and extends to peripheral edges of the assembly.

22. The assembly of claim 21, wherein the semiconductor device is an LED package that includes an LED chip, is mounted on the cap and the pad, is electrically connected to the pad using a first solder joint and is thermally connected to the cap using a second solder joint.

23. The assembly of claim 21, wherein the semiconductor device is a semiconductor chip that is mounted on the cap, is electrically connected to the pad using a wire bond and is thermally connected to the cap using a die attach.

24. The assembly of claim 21, wherein the substrate is spaced from the post and the base and the adhesive fills the gap and the space between the base and the substrate where the base overlaps the substrate and is contained in the space between the heat spreader and the substrate.

25. The assembly of claim 21, wherein the post has a diameter that decreases as it extends upwardly from the base to the cap and the post, the base and the cap include copper.

26. A semiconductor chip assembly, comprising:
a semiconductor device;
an adhesive that includes an opening;
a heat spreader that includes a post and a base, wherein the post is adjacent to and integral with the base and extends above the base in an upward direction, and the base extends below the post in a downward direction opposite the upward direction and extends laterally from the post in lateral directions orthogonal to the upward and downward directions; and
a substrate that includes a pad, a terminal, a routing line, first and second vias and a dielectric layer, wherein the pad and the terminal extend above the dielectric layer, the routing line extends below the dielectric layer, the vias each extend through the dielectric layer to the routing line, an electrically conductive path between the pad and the terminal includes in sequence the first via, the routing line and the second via, and an aperture extends through the substrate;

wherein the semiconductor device is mounted on the heat spreader, overlaps the post, is electrically connected to the pad and thereby electrically connected to the terminal, and is thermally connected to the post and thereby thermally connected to the base;

wherein the adhesive is mounted on and extends above the base, contacts the post and the base, extends into a gap in the aperture between the post and the substrate, extends across the dielectric layer in the gap and is sandwiched between the post and the dielectric layer, between the base and the dielectric layer and between the base and the routing line;

wherein the substrate is mounted on the adhesive, extends above the base and is spaced from the post and the base, and the routing line is embedded in the adhesive; and wherein the post extends into the opening and the aperture and above and below the dielectric layer and is coplanar with the adhesive above the dielectric layer and above a bottom surface of the pad and below a top surface of the pad, and the base extends below the semiconductor device, the adhesive and the substrate.

27. The assembly of claim 26, wherein the adhesive contacts the post and the dielectric layer in the gap, contacts the base, the dielectric layer and the routing line outside the gap, covers the substrate in the downward direction, covers and surrounds the post in the lateral directions, fills the gap, fills the space between the base and the substrate where the substrate overlaps the base, is contained in the space between the heat spreader and the substrate and extends to peripheral edges of the assembly.

28. The assembly of claim 26, wherein the post has a cut-off conical shape in which its diameter decreases as it extends upwardly from the base.

29. The assembly of claim 26, wherein the heat spreader includes a cap that extends above and is adjacent to and covers in the upward direction and extends laterally in the lateral directions from a top of the post and the cap contacts and overlaps the adhesive and is coplanar with the pad and the terminal above the adhesive and the dielectric layer at a surface that faces in the upward direction.

30. The assembly of claim 29, wherein the post is copper, the base, the cap, the pad and the terminal consist of copper and a plated contact that provides a surface finish on the copper and the cap is copper where it is adjacent to the post.

31. A semiconductor chip assembly, comprising:
a semiconductor device;
an adhesive that includes an opening;
a heat spreader that includes a post and a base, wherein the post is adjacent to and integral with the base and extends above the base in an upward direction, and the base extends below the post in a downward direction opposite the upward direction and extends laterally from the post in lateral directions orthogonal to the upward and downward directions; and
a substrate that includes a pad, a terminal, a routing line, first and second vias and a dielectric layer, wherein the pad and the terminal contact and extend above the dielectric layer and have the same thickness and are coplanar with one another at a surface that faces in the upward direction, the routing line contacts and extends below the dielectric layer, the vias each contact and extend through the dielectric layer to the routing line, an electrically conductive path between the pad and the terminal includes in sequence the first via, the routing line and the second via, and an aperture extends through the substrate;

wherein the semiconductor device is mounted on the heat spreader, overlaps the post, is electrically connected to the pad and thereby electrically connected to the terminal, and is thermally connected to the post and thereby thermally connected to the base;

wherein the adhesive is mounted on and extends above the base, extends into a gap in the aperture between the post and the substrate, and contacts and is sandwiched between the post and the dielectric layer in the gap, between the base and the dielectric layer outside the gap and between the base and the routing line outside the gap;

wherein the substrate is mounted on the adhesive, extends above the base and is spaced from the post and the base, and the routing line is embedded in the adhesive; and wherein the post extends into the opening and the aperture and is coplanar with the adhesive above the dielectric layer and above bottom surfaces of the pad and the terminal and below top surfaces of the pad and the terminal and is coplanar with the adhesive below the dielectric layer at the base, the post and the adhesive in combination fill the aperture, and the base extends below the semiconductor device, the adhesive and the substrate, covers the semiconductor device, the post, the substrate and the adhesive in the downward direction and extends to peripheral edges of the assembly.

32. The assembly of claim 31, wherein the adhesive covers the substrate in the downward direction, covers and surrounds the post in the lateral directions, fills the gap, fills the space between the base and the substrate where the substrate overlaps the base, is contained in the space between the heat spreader and the substrate and extends to peripheral edges of the assembly.

33. The assembly of claim 31, wherein the post has a cut-off conical shape in which its diameter decreases as it extends upwardly from the base.

34. The assembly of claim 31, wherein the heat spreader includes a cap that extends above and is adjacent to and covers in the upward direction and extends laterally in the lateral directions from a top of the post and the cap contacts and overlaps the adhesive and is coplanar with the pad and the terminal above the adhesive and the dielectric layer at a surface that faces in the upward direction.

35. The assembly of claim 34, wherein the post is copper, the base, the cap, the pad and the terminal consist of copper and a plated contact that provides a surface finish on the copper and the cap is copper where it is adjacent to the post.

* * * * *